US012627028B2

(12) United States Patent
Suh et al.

(10) Patent No.: US 12,627,028 B2
(45) **Date of Patent: *May 12, 2026**

(54) ANTENNA MODULE IMPLEMENTED IN MULTI-LAYERED PACKAGE

(71) Applicant: LG ELECTRONICS INC., Seoul (KR)

(72) Inventors: Yusuhk Suh, Seoul (KR); Dongik Lee, Seoul (KR); Seungmin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 35 days.

This patent is subject to a terminal disclaimer.

(21) Appl. No.: 18/737,181

(22) Filed: Jun. 7, 2024

(65) Prior Publication Data

US 2025/0070447 A1     Feb. 27, 2025

(30) Foreign Application Priority Data

Aug. 25, 2023    (KR) ........................ 10-2023-0112087

(51) Int. Cl.
| | |
|---|---|
| *H01Q 1/22* | (2006.01) |
| *H01Q 1/48* | (2006.01) |
| *H01Q 9/04* | (2006.01) |
| *H01Q 21/06* | (2006.01) |
| *H05K 1/02* | (2006.01) |

(52) U.S. Cl.
CPC ................ *H01Q 1/22* (2013.01); *H01Q 1/48* (2013.01); *H01Q 9/0414* (2013.01); *H01Q* 9/045 (2013.01); *H01Q 21/065* (2013.01); *H05K 1/0243* (2013.01); *H05K 2201/10098* (2013.01)

(58) Field of Classification Search
CPC ........... H01Q 1/22; H01Q 1/48; H01Q 1/523; H01Q 1/2283; H01Q 9/045; H01Q 9/0414; H01Q 9/0457; H01Q 21/08; H01Q 21/065
See application file for complete search history.

(56) References Cited

U.S. PATENT DOCUMENTS

| | | | | |
|---|---|---|---|---|
| 11,108,170 | B2 * | 8/2021 | Chakraborty | ........ H01Q 21/245 |
| 11,276,926 | B2 * | 3/2022 | Yun | ........................ H01Q 1/243 |
| 12,244,072 | B2 * | 3/2025 | Ueda | .................... H01Q 21/065 |
| 2019/0252771 | A1 * | 8/2019 | Yong | ..................... H01Q 21/22 |
| 2020/0259267 | A1 * | 8/2020 | Park | .................. H01Q 21/0025 |
| 2021/0044001 | A1 * | 2/2021 | Kang | ..................... H01L 23/13 |
| 2021/0210869 | A1 * | 7/2021 | Lee | ...................... H01Q 21/062 |

* cited by examiner

*Primary Examiner* — Tung X Le

(74) *Attorney, Agent, or Firm* — LEE, HONG, DEGERMAN, KANG & WAIMEY

(57) ABSTRACT

An antenna module includes: a printed circuit board (PCB) having a plurality of layers; an array antenna portion having a plurality of antenna elements disposed on the PCB; and a plurality of signal connection lines configured to electrically connect a radio frequency integrated circuit (RFIC) chip to the array antenna portion. Each of the plurality of antenna elements may have a structure with two patch antennas, and first and second groups of second patch antennas disposed inside the PCB may be located in first and second regions with respect to a center line of an inner layer where the second patch antennas are disposed.

12 Claims, 13 Drawing Sheets

ANTENNA MODULE IMPLEMENTED IN MULTI-LAYERED PACKAGE

CROSS-REFERENCE TO RELATED APPLICATION

Pursuant to 35 U.S.C. § 119(a), this application claims the benefit of earlier filing date and right of priority to Korean Patent Application No. 10-2023-0112087, filed on Aug. 25, 2023, the contents of which are all hereby incorporated by reference herein in their entireties.

TECHNICAL FIELD

The present disclosure relates to a multi-layered circuit type antenna package for millimeter wave band communication.

BACKGROUND ART

A millimeter wave (mm Wave) band communication method, which is being developed to transmit GBps-level high-speed, large-capacity AV data, can transmit large-capacity data several times faster than existing short/mid-range communication methods such as WiFi, WLAN, WPAN, etc.

This millimeter wave band communication method, unlike the existing short/mid-range communication methods, is very difficult to be implemented in a manner of connecting an antenna and an RFIC, which are separately provided, with a cable. In the millimeter wave band, a signal attenuation phenomenon is dozens of times higher than those in existing commercial frequency bands. In addition, a signal cable dedicated to the millimeter wave band is a major obstacle to the commercialization of 60 GHz communication modules, due to unit prices reaching up to tens of dollars. Therefore, in the millimeter wave band, a technology for designing antenna and package are required to dispose an antenna and an RFIC within the shortest distance, to suppress signal loss and attenuation.

As the related art technology for implementing a millimeter wave band antenna/package, a technology of embedding an antenna and a stripline or microstrip type signal transmission line in a multi-layer circuit and electrically connecting the same to an RFIC is widely used. This method implements a transverse electromagnetic (TEM) mode required for a wideband signal line, thereby widening a bandwidth required in the millimeter wave band.

The multi-layer circuit type using the stripline or microstrip is an ideal way for realizing antenna performance. However, in the case of a stripline, a signal line is disposed on a middle layer and ground layers are disposed above and below the signal line, so at least three layers are required. Additionally, in the case of a microstrip, at least two layers are required, including a layer where a signal line is disposed and a ground layer disposed above or below the signal line. Therefore, when designing a multi-layer circuit by combination of antenna, RF interface, inner cavity, power line, etc., the number of layers stacked reaches approximately 7 to 10 layers. In the case of a low temperature co-fired ceramic (LTCC) process that implements this, it needs high production costs, which is an obstacle to the commercialization of the millimeter wave communication technology.

SUMMARY

An aspect of the present disclosure is to provide a structure that minimizes the number of stacked layers as a multi-layered circuit type antenna package for millimeter wave band communication.

Another aspect of the present disclosure is to provide a structure that minimizes a signal phase difference for each patch in a patch array antenna structure for millimeter wave band communication.

An antenna module implemented as a multi-layered package according to the present disclosure includes: a printed circuit board (PCB) having a plurality of layers; an array antenna portion having a plurality of antenna elements disposed on the PCB, and a plurality of signal connection lines configured to electrically connect the RFIC chip to the array antenna portion. Each of the plurality of antenna elements may have a structure with two patch antennas, and first and second groups of the second patch antennas disposed inside the PCB may be located in first and second regions with respect to a center line of an inner layer where the second patch antennas are disposed.

According to an embodiment, a first patch antenna of the two patch antennas may be disposed on a first surface of the PCB, and the first surface may be an outermost surface of the PCB. The RFIC chip may be bonded to a second surface of the PCB. A second patch antenna of the two patch antennas may be disposed to be spaced apart from the first patch antenna and may be disposed on one of the plurality of layers inside the PCB. A portion of the first patch antenna and a portion of the second patch antenna may be stacked to overlap each other.

According to an embodiment, the signal connection lines may include a first part disposed horizontally on a first layer, a second part connected to the first part and disposed vertically as an inner layer of the PCB, a third part connected to the second part and disposed on any one layer inside the PCB, and a fourth part disposed vertically to be connected to the third part and the second patch antennas. The first patch antennas disposed on the outermost surface of the PCB may be disposed at a certain gap on the outermost surface in a first horizontal axis direction.

According to an embodiment, a first group of the second patch antennas disposed inside the PCB may be electrically connected to the fourth parts of the signal connection lines in a first region based on a center line of an inner layer where the second patch antennas are disposed. A second group of the second patch antennas disposed inside the PCB may be electrically connected to the fourth parts of the signal connection lines in a second region based on the center line of the inner layer where the second patch antennas are disposed.

The above-mentioned multi-layered circuit type antenna package presents a structure that can wirelessly transmit broadband signals by minimizing the number of stacks.

The above-described multi-layered circuit type antenna package has low loss during signal transmission and is economical in process cost.

Further scope of applicability of the present disclosure will become apparent from the following detailed description. It should be understood, however, that the detailed description and specific examples, such as the preferred embodiment of the present disclosure, are given by way of illustration only, since various modifications and alternations within the idea and similar scope of the disclosure will be apparent to those skilled in the art.

BRIEF DESCRIPTION OF THE DRAWINGS

FIG. 8C is a diagram illustrating first and seventh layers of the antenna module of FIG. 4.

DETAILED DESCRIPTION OF THE EMBODIMENTS

A description will now be given in detail of specific embodiments of the present disclosure, together with drawings.

Hereinafter, a description will be given in more detail of embodiments related to the present disclosure, with reference to the accompanying drawings. In general, a suffix such as "module" and "unit" may be used to refer to elements or components. Use of such a suffix herein is merely intended to facilitate description of the specification, and the suffix itself is not intended to give any special meaning or function.

Figure 1:
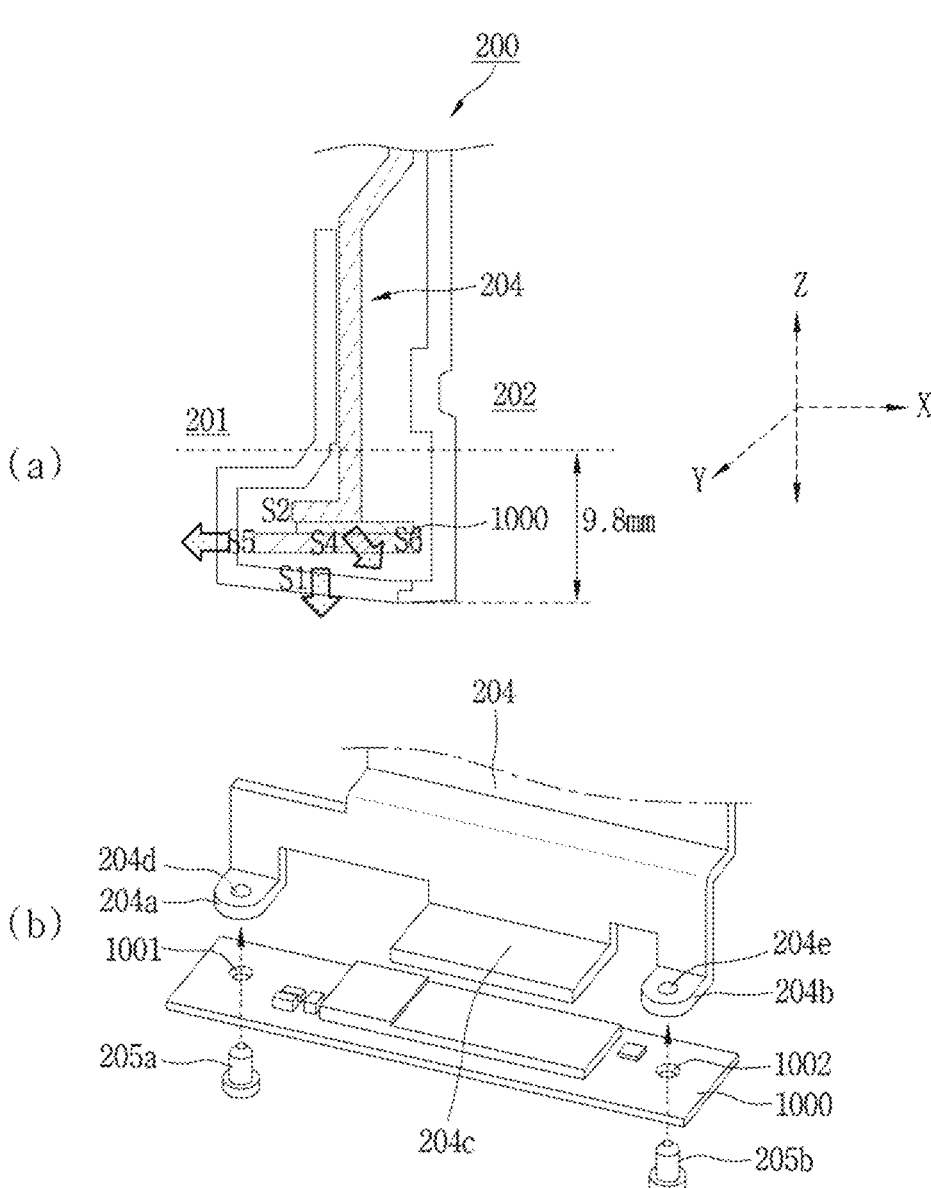
FIG. 1 is a view illustrating a structure that an antenna module according to an embodiment is disposed on an electronic device and a structure that the antenna module is coupled to the electronic device.

Meanwhile, the antenna module according to the present disclosure may be disposed in a horizontal disposition structure. In this regard, FIG. 1 is a view illustrating a structure that an antenna module according to an embodiment is disposed on an electronic device and a structure that the antenna module is coupled to the electronic device. (a) of FIG. 1 illustrates a structure that the antenna module 1000 is disposed in a bottom region of the electronic device 200. (b) of FIG. 1 illustrates a structure that the antenna module 1000 is coupled to a support structure such as a heat sink 204.

Referring to (a) of FIG. 1, the antenna module 1000 may be coupled to an end portion of the heat sink 204 disposed in a space between a first cover 201 and a second cover 202. The antenna module 1000 may include a plurality of surfaces S1 to S6. A first surface S1 of the plurality of surfaces may face a downward direction of the electronic device 200, and a second surface S2 may face an upward direction of the electronic device 200. A third surface S3 of the plurality of surfaces may face a left direction of the electronic device 200, and a fourth surface S4 may face a right direction of the electronic device 200. A fifth surface S5 of the plurality of surfaces may face a front direction of the electronic device 200, and a sixth surface (not illustrated) may face the rear direction of the electronic device 200.

A length of a lower end portion of the first cover 201 to which the antenna module 1000 is coupled may be implemented as a predetermined length (e.g., 9.8 mm) or less. One end portion and a rear surface of the antenna module 1000 may be coupled to a side region and a rear surface of the first cover 201, such that the antenna module 1000 is disposed parallel to a horizontal plane. A structure to be assembled or pressed may be assembled or pressed in a downward or upward direction.

Referring to (b) of FIG. 1, a support structure, such as the heat sink 204, includes a first end portion 204a, a second end portion 204b, and a third end portion 204c that are coupled to the antenna module 1000. A first hole 204d and a second hole 204e may be formed through the first end portion 204a and the second end portion 204b of the heat sink 204, respectively. In the antenna module 1000, a region where an electronic component such as an RFIC chip is disposed may be coupled to the third end portion 204c of the heat sink 204. Accordingly, heat generated from the electronic component such as the RFIC chip may be discharged to an external region through the heat sink 204.

A plurality of holes may be formed in a specific region where the radiator of the antenna module 1000 is not disposed. A first through hole 1001 and a second through hole 1002 may be formed through one side and another side of the antenna module 1000. A first screw 205a may be coupled to the first hole 204d of the heat sink 204 and the first through hole 1001 of the antenna module 1000. A second screw 205b may be coupled to the second hole 204e of the heat sink 204 and the second through hole 1002 of the antenna module 1000. Referring to FIG. 1, the antenna module 1000 may be coupled to the support structure such as the heat sink 204 through the coupling structure of the screws and holes.

Figure 2:
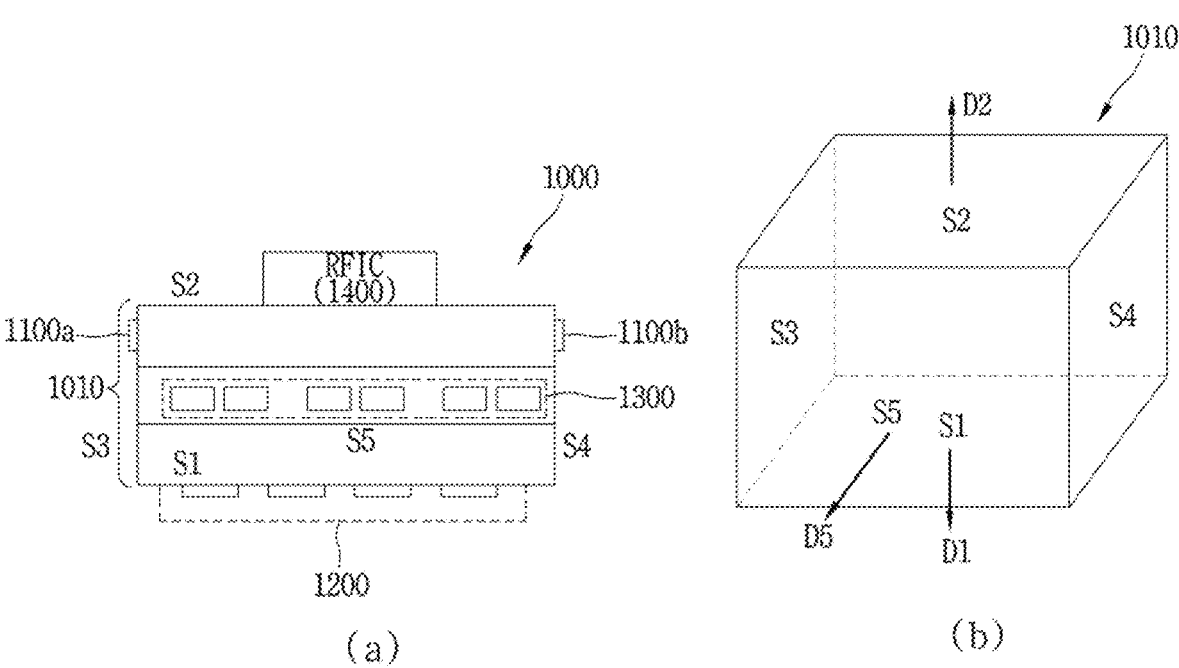
FIG. 2 illustrates a cross-sectional view and a three-dimensional structure of a substrate on which the antenna module is disposed.
Figure 3:
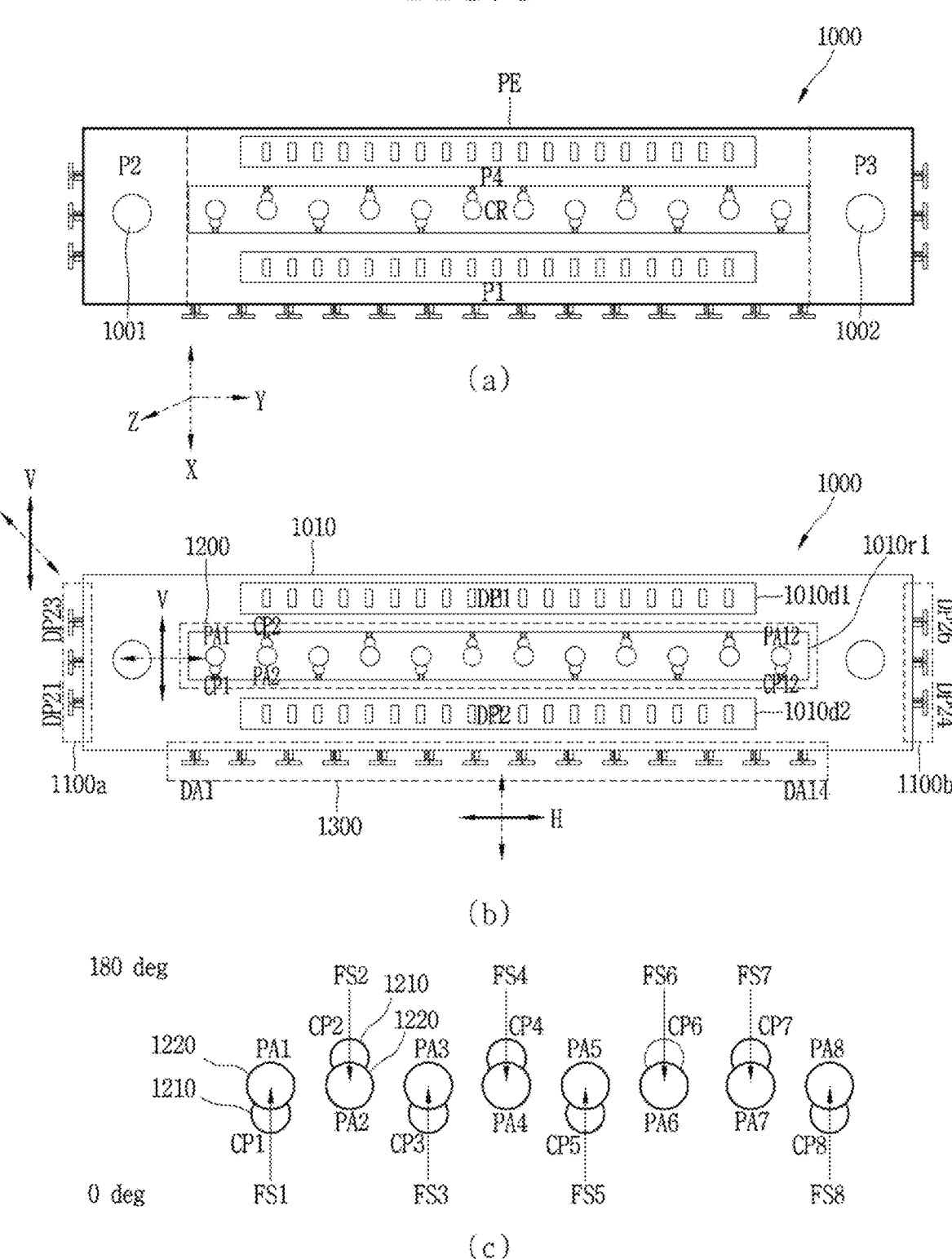
FIG. 3 is a front view of the substrate on which the antenna module is disposed.
Figure 4:
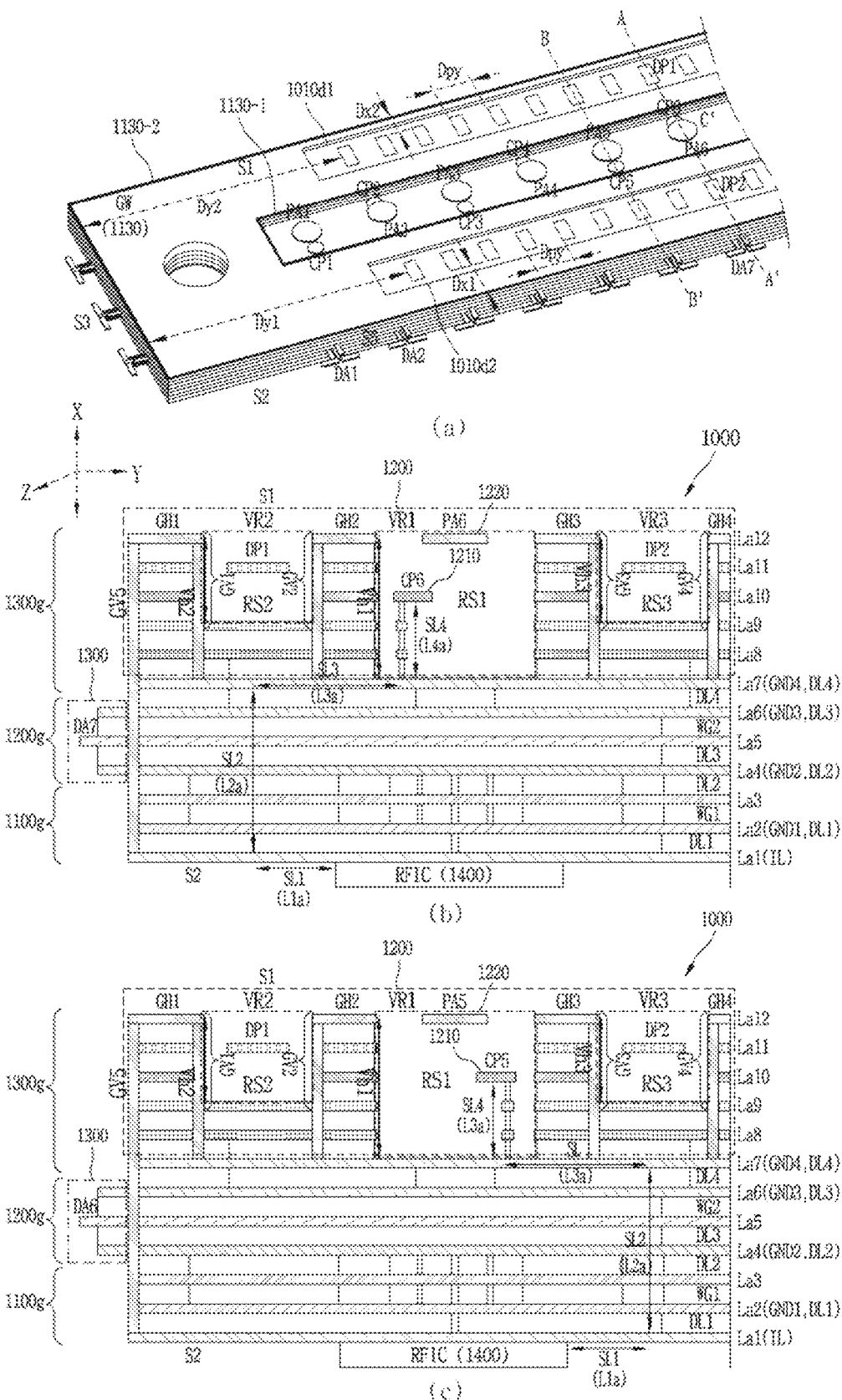
FIG. 4 illustrates a partial perspective view of the antenna module of FIG. 2 and a cross-sectional view of the antenna module on a specific line.

Hereinafter, an antenna module that may be disposed in an electronic device according to the present disclosure will be described. In this regard, FIG. 2 illustrates a cross-sectional view and a three-dimensional structure of a substrate on which the antenna module is disposed. FIG. 3 is a front view of the substrate on which the antenna module is disposed. Meanwhile, FIG. 4 illustrates a partial perspective view of the antenna module of FIG. 2 and a cross-sectional view of the antenna module on a specific line.

(a) of FIG. 2 is a cross-sectional view of the antenna module 1000 illustrating a structure in which a plurality of array antennas are disposed on a substrate 1010. (b) of FIG. 2 is a diagram illustrating a three-dimensional structure of the substrate 1010 having a plurality of surfaces. Referring to FIG. 2, the substrate 1010 may include a first surface S1 through a sixth surface S6. The third array antenna 1200 may be disposed on the first surface S1 of the substrate 1010. The RFIC chip 1400 may be disposed on the second surface S2 of the substrate 1010. The first and second array antennas 1010a and 1100b may be disposed on the third surface S3 and the fourth surface S4 of the substrate 1010. The fourth array antenna 1300 may be disposed on the fifth surface S5 of the substrate 1010.

(a) of FIG. 3 illustrates a substrate with the antenna module 1000, which is divided for each region. (b) of FIG. 3 is a diagram illustrating array antennas disposed in each region of the antenna module 1000. (c) of FIG. 3 is a diagram illustrating a structure in which a feed signal is applied to some antenna elements disposed in an array antenna disposition region.

Referring to FIG. 3, the substrate 1010 may include a central region CR and a periphery PE surrounding the central region CR. The periphery PE of the substrate 1010 may include a first part P1 through a fourth part P4. The first part P1 constitutes a bottom region of the substrate 1010, and the second part P2 constitutes one side region of the substrate 1010. The third part P3 constitutes another side region of the substrate 1010, and the fourth part P4 constitutes a top region of the substrate 1010. The antenna module 1000 may be configured to include the substrate 1010, and a third array antenna 1200 disposed in an array antenna disposition region 1010r1.

(a) of FIG. 4 is a perspective view illustrating one side region based on the center of the antenna module 1000. (b) of FIG. 4 is a cross-sectional view according to the line AA' of the antenna module 1000. (c) of FIG. 4 is a cross-sectional view according to the line BB' of the antenna module 1000.

Referring to FIGS. 2 to 4, the first and second array antennas 1100a and 1100b may be disposed on the third surface S3 and the fourth surface S4 of the substrate 1010. The third array antenna 1200 may be disposed on the first surface S1 and an inner space of the substrate 1010. The fourth array antenna 1300 may be disposed on the fifth surface S5 of the substrate 1010. A region where the fourth array antenna 1300 is disposed may form a first ground layer 1100g having a first coplanar waveguide structure. A region where the first and second array antennas 1100a and 1100b are disposed may form a second ground layer 1200g having a second coplanar waveguide structure. A region where the third array antenna 1200 is disposed may form a third ground layer 1300g having a third coplanar waveguide structure.

An inner ground wall (GW) 1130-1 formed inside the PCB 1010 may operate as a ground for radiation of the patch antennas PA1 to PA12 and CP1 to CP12. A ground wall (GW) 1130 functions as a reflector that suppresses side surface radiation of the patch antennas PA1 to PA12 and CP1 to CP12. In addition, an outer ground wall 1130-2 formed on an outer surface of the PCB, namely, the substrate 1010 suppresses radiation to an opposing side surface of the dipole antennas DA21 to DA26 having a side surface radiation structure, and functions as a reflector toward the corresponding side surface. The ground wall (GW) 1130 suppresses rear surface radiation of the dipole antennas DA1 to DA14 having a front surface radiation structure, and functions as a reflector toward the front surface.

The ground wall (GW) 1130 is formed on side surface portions of the antenna module 1000 by a plurality of vias connecting the ground layers formed on the plurality of layers. The ground wall (GW) 1130 may include horizontal ground walls GH1 to GH4 and vertical ground walls GV1 to GV4. The dummy patterns DP1 and DP2 may be disposed inside spaces defined by the horizontal ground walls GH1 to GH4, the vertical ground walls GV1 to GV4, and the ground layer inside the PCB.

Distances between the ground wall (GW) 1130 and the dummy patches DP1 to DP2, respective sizes thereof, and the like may be implemented within predetermined ranges based on a half-wavelength period of an operating frequency of 60 GHz. Here, the distance Dy1, Dx1 between the ground wall (GW) 1130 and the dummy pattern DP1 is defined as a distance from the dummy pattern DP1 to the top of the ground wall (GW) 1130 on the horizontal and vertical axes. The distance Dy2, Dx2 between the ground wall (GW) 1130 and the dummy pattern DP2 is defined as a distance from the dummy pattern DP2 to the bottom of the ground wall (GW) 1130 on the horizontal and vertical axes. A distance Dpy between the dummy patterns DP1 and DP2 adjacent to each other in the horizontal axial direction may be implemented within a predetermined range based on a half-wavelength of 60 GHz. The layer location and size of the second patch antennas 1210, which are coupling patches, and the overlap region with the first patch antennas 1220 may be designed in consideration of radiation characteristics and array characteristics.

Hereinafter, the antenna module 1000 according to the present disclosure will be described with reference to FIGS. 1 to 4. The antenna module 1000 may be configured to include a substrate 1010, first to fourth array antennas 1100a, 1100b, 1200, and 1300, and an RFIC 1400 which is a millimeter wave transceiver circuitry.

The substrate 1010 may include a first surface S1, a second surface S2, and a periphery PE. The periphery PE may be formed between the first surface S1 and the second surface S2. The first surface S1 may be opposite to the second surface S2. A ground region, an array antenna disposition region 1010r1, a first dummy array pattern region 1010d1, and a second dummy array pattern region 1010d2 may be formed on the first surface S1. The substrate 1010 may be implemented as a multi-layer substrate. For example, the substrate 1010 may be implemented as a substrate with twelve layers, but is not limited thereto, and may vary depending on applications.

The first surface S1 may be an outermost surface of the PCB 1010. The first surface S1 may be formed of a metal layer connected to the ground. On the inner surface of the metal layer may be disposed a first region RS1 where the first patch antenna 1220 is disposed, and a second region RS2 and a third region RS3 which are located on both sides of the first region RS1 and do not operate as a ground.

A first vertical region VR1 which is the same region as the first region RS may be formed from the outermost surface of the PCB 1010 to an upper ground layer of an antenna direction which is an inner layer where the signal connection lines of the third part SL3 are disposed inside the PCB. The patch antennas 1210 and 1220 and a dielectric material may be disposed in the first vertical region VR1. The outer peripheral surface of the first vertical region VR1 may form ground walls.

A second vertical region VR2 which is the same region as the second region RS2 may be formed from the outermost surface of the PCB 1010 to the ground layer inside the PCB. First parasitic metals DP1 and a dielectric material may be disposed in the second vertical region VR2. The outer peripheral surface of the second vertical region VR2 may form ground walls. A third vertical region VR3 which is the same region as the third region RS3 may be formed from the outermost surface of the PCB 1010 to the ground layer inside the PCB. Second parasitic metals DP2 and a dielectric material may be disposed in the third vertical region VR3. The outer peripheral surface of the third vertical region VR3 may form ground walls. The first parasitic metals DP1 and the second parasitic metals DP2 may correspond to first dummy patterns and second dummy patterns.

A first vertical height Vh1 of the first vertical region VR1 may be higher than a second vertical height Vh2 of the second vertical region VR2. The first vertical height Vh1 of the first vertical region VR1 may be higher than a third vertical height Vh3 of the third vertical region VR3. The second vertical height Vh2 of the second vertical region VR2 may be the same as the third vertical height Vh3 of the third vertical region VR3.

The first surface S1 of the substrate 1010 is divided into a central region CR, a first part P1, a second part P2, a third part P3, and a fourth part P4. The second part P1 may be defined on the left side of the first part P1 and the third part P3 is defined on the right side. A ground region is disposed in the first part P1 and a second dummy array pattern region 1010d2 is formed therein. An array antenna disposition region 1010r1 is formed in the central region CR. A ground region is disposed in the fourth part P4 and a first dummy array pattern region 1010d1 is formed therein. A ground region is disposed in the second part P2 and a first through hole 1001 is disposed inside the ground region. A ground region is disposed in the third part P3 and a second through hole 1002 is disposed inside the ground region. Screws may be inserted into the first through hole 1001 of the second part P2 and the second through hole 1002 of the third part P3, so that the antenna module 1000 is coupled to the support structure such as the heat sink inside the electronic device.

The first array antenna 1100a is disposed in an outer peripheral surface (PE) region of the second part P2. The second array antenna 1100b is disposed in an outer peripheral surface region of the third part P3. The first array antenna 1100a and the second array antenna 1100b may form beam patterns to side regions of the electronic device. The first array antenna 1100a and the second array antenna 1100b may radiate horizontally polarized signals to the side regions of the electronic device.

The first array antenna 1100b may include a plurality of dipole antennas DA21 to DA23. The second array antenna 1100b may include a plurality of dipole antennas DA24 to DA26. The first array antenna 1100a and the second array antenna 1100b may be implemented to have three antenna elements on one side and another side of the periphery PE of the substrate 1010a, respectively. The first array antenna 1100a may be implemented as a 1×3 array antenna on the one side of the substrate 1010, but is not limited thereto. The second array antenna 1100b may be implemented as a 1×3 array antenna on the another side of the substrate 1010, but is not limited thereto.

The third array antenna 1200 may be disposed on the first surface S1 of the substrate 1010. The third array antenna 1200 may form a beam pattern toward the bottom region of the electronic device. The second array antenna 1300b may radiate a vertically polarized signal to the bottom region of the electronic device. The third array antenna 1200 may be implemented to have twelve antenna elements on the central region CR of the substrate 1010.

The third array antenna 1200 may include a plurality of first patch antennas PA1 to PA12 disposed on the first surface S1 of the substrate 1010. The dummy patterns DP1 and DP2 may be disposed on top and bottom regions of the first patch antennas PA1 to PA12 on the XY plane, thereby suppressing side surface radiation. The third array antenna 1300b may be implemented as a 1×12 array antenna on the center region CR of the substrate 1010, but is not limited thereto.

Each patch antenna of the third array antenna 1200 may include a first patch antenna 1220 and a second patch element 1210. The second patch antennas 1210 may be stacked in a Z-axis direction, which is a height direction, on the first patch antennas 1220 such that signals of the first patch antennas 1220 are coupled. The center of the second patch antenna 1210 may be offset from the center of the first patch antenna 1220 in a Y-axis direction that is a horizontal axial direction.

In this regard, the second patch antennas 1210 in the first, third, fifth, eighth, tenth, and twelfth rows may be disposed to be offset with respect to the first patch antennas 1220 to a bottom region based on the Y-axis. The second patch antennas 1210 in the second, fourth, sixth, seventh, ninth, and eleventh rows may be disposed to be offset with respect to the first patch antennas 1220 to a top region based on the X-axis. Accordingly, the second patch antennas 1220 may alternately be offset in different directions with respect to the first patch antennas 1220.

A current direction of signals applied to the second patch antennas 1210 in the first, third, fifth, eighth, tenth, and twelfth rows is from bottom to top. A current direction of signals applied to the second patch antennas 1210 in the second, fourth, sixth, seventh, ninth, and eleventh rows is from top to bottom. Accordingly, the current direction of the signals applied to the second patch antennas 1210, which are alternately offset in different directions, and that of the corresponding first patch antennas 1220 are opposite to each other. Therefore, a phase difference between the signals applied to the second patch elements 1210, which are alternately disposed to be offset, is supposed to be 180 degrees so that the current flows in the same direction. To this end, the RFIC 1400 may control a phase shifter such that the phase difference between the signals applied to the second patch elements 1210 is 180 degrees.

In this regard, a first feed signal FS1 may be applied to a coupling patch CP1, which is the second patch antenna 1210 in the first row. A second feed signal FS2 may be applied to a coupling patch CP2, which is the second patch antenna 1210 in the second row. If the first and second feed signals FS1 and FS2 are in-phase signals, electric fields are formed in opposite directions in the coupling patches CP1 and CP2. A directional beam may be formed only when the electric field directions of the coupling patches CP1 and CP2 are the same. For this purpose, a phase difference between the first feed signal FS1 and the second feed signal FS2 needs to be 180 degrees.

Likewise, a seventh feed signal FS7 may be applied to a coupling patch CP7, which is the second patch antenna 1210 in the seventh row. An eighth feed signal FS8 may be applied to a coupling patch CP8, which is the second patch antenna 1210 in the eighth row. If the seventh and eighth feed signals FS7 and FS8 are in-phase signals, the electric fields may be formed in opposite directions in the coupling patches CP7 and CP8. A directional beam may be formed only when the electric field directions of the coupling patches CP7 and CP8 are the same. To this end, the phase difference between the seventh feed signal FS7 and the eighth feed signal FS8 needs to be 180 degrees.

Accordingly, the first, third, fifth, and eighth feed signals FS1, FS3, FS5, and FS8 applied to the coupling patches CP1, CP3, CP5, and CP8, which are the second patch antennas 1210 in the first, third, fifth, and eighth rows, have a first phase value. On the other hand, the second, fourth, sixth, and seventh feed signals FS2, FS4, FS6, and FS7, which are applied to the coupling patches CP2, CP4, CP6, and CP7, which are the second patch antennas 1210 in the second, fourth, sixth, and seventh rows, have a second phase value which has a phase difference of 180 degrees from the first phase value.

The fourth array antenna 1300 may be disposed on the first part P1 of the periphery PE of the substrate 1010. The fourth array antenna 1300 may form a beam pattern toward the front region of the electronic device. The fourth array antenna 1300 may radiate a horizontally polarized signal to the front region of the electronic device.

The fourth array antenna 1300 may include a plurality of dipole antennas DA1 to DA14 disposed on the first part P1 of the periphery PE of the substrate 1010. The fourth array antenna 1300 may be implemented to have 14 antenna elements on the lower side of the periphery PE of the substrate 1010. The fourth array antenna 1300 may be implemented as a 1×14 array antenna on the lower side of the periphery PE of the substrate 1010, but is not limited thereto.

The RFIC 1400 may be configured to transmit and receive signals at frequencies between 10 GHz and 400 GHz using at least one of the first and second array antennas 1100*a* and 1100*b*, the third array antenna 1200, and the fourth array antenna 1300. The RFIC 1400 may be configured to transmit and receive signals at frequencies between 10 GHz and 400 GHz using at least one of the plurality of dipole antennas DA21 to DA26, the plurality of patch antennas PA1 to PA12, CP1 to CP12, and the plurality of dipole antennas DA1 to DA14. The RFIC 1400 may be referred to as a radio frequency integrated chip.

The number of elements of the fourth array antenna 1300 forming the beam pattern toward the front region may be set to be greater than the number of elements of the third array antenna 1200 forming the beam pattern toward the bottom region. The number of elements of the third array antenna 1200 forming the beam pattern toward the bottom region may be set to be greater than the number of elements of the first and second array antennas 1100*a* and 1100*b* forming the beam patterns toward the side regions.

In this regard, 12 pins of 32 pins of the RFIC 1400 may be connected to the third array antenna 1200 forming the beam pattern toward the bottom region. 14 pins of the 32 pins of the RFIC 1400 may be connected to the fourth array antenna 1300 forming the beam pattern toward the front region. 6 pins of the 32 pins of the RFIC 1400 may be connected to the first and second array antennas 1100*a* and 1100*b* forming the beam patterns toward the side regions.

In this regard, since the fourth array antenna 1300 has the largest number of elements, it can transmit signals over a long distance to the front region of the electronic device, but has a narrow beam coverage. The narrow beam coverage can be supplemented by changing a direction of beam to a horizontal direction of the front region through beamforming. The number of elements of the fourth array antenna 1300 may be plural in the Y-axis direction and one in the Z-axis direction. For example, the fourth array antenna 1300 may be implemented as a 1×14 array antenna.

The electronic device needs to perform wireless communication with another electronic device disposed in the bottom region thereof. For wireless communication, beamforming may be implemented in units of narrow beam coverage in a horizontal direction, which is the Y-axis direction, in the bottom region of the electronic device. Meanwhile, it is not necessary to transmit a signal to the bottom region of the electronic device over a longer distance than the front region. The number of elements of the third array antenna 1200 may be plural in one axial direction and one in another axial direction. For example, the third array antenna 1200 may be implemented as a 1×8, 1×10, or 1×12 array antenna.

Signals may be transferred to the side regions of the electronic device in an indoor radio wave environment where the electronic device is disposed. It is more important to implement a wide beam coverage for the side regions of the electronic device even without beamforming, than to implement a signal transmission over a long distance. In this regard, since the number of elements of the first and second array antennas 1100*a* and 1100*b* is the smallest, a wide beam coverage to the side regions of the electronic device can be achieved. Accordingly, the number of elements of the first and second array antennas 1100*a* and 1100*b* may be plural in the one axial direction and one in the another axial direction. For example, the first and second array antennas 1100*a* and 1100*b* may be implemented as a 1×3 array antenna on one side and another side.

Figure 5A:
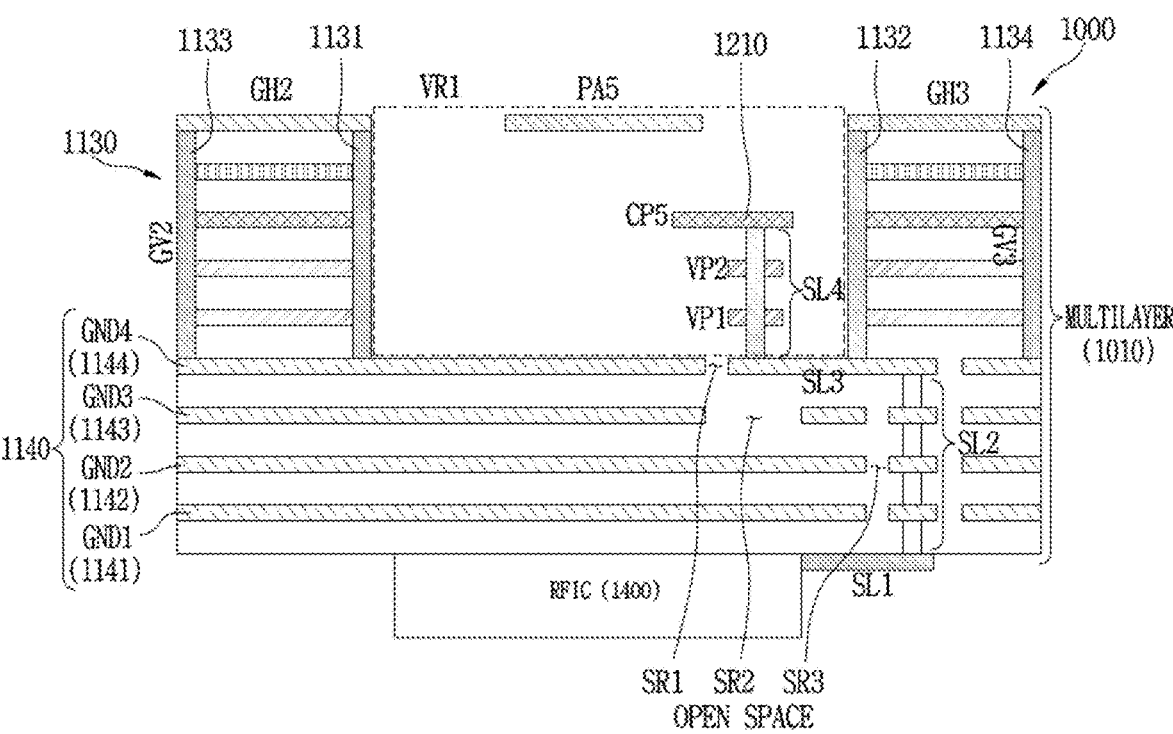
FIG. 5A is a lateral view illustrating a partial region of the antenna module with patch antennas having an overlap structure, illustrated in FIG. 4
Figure 5B:
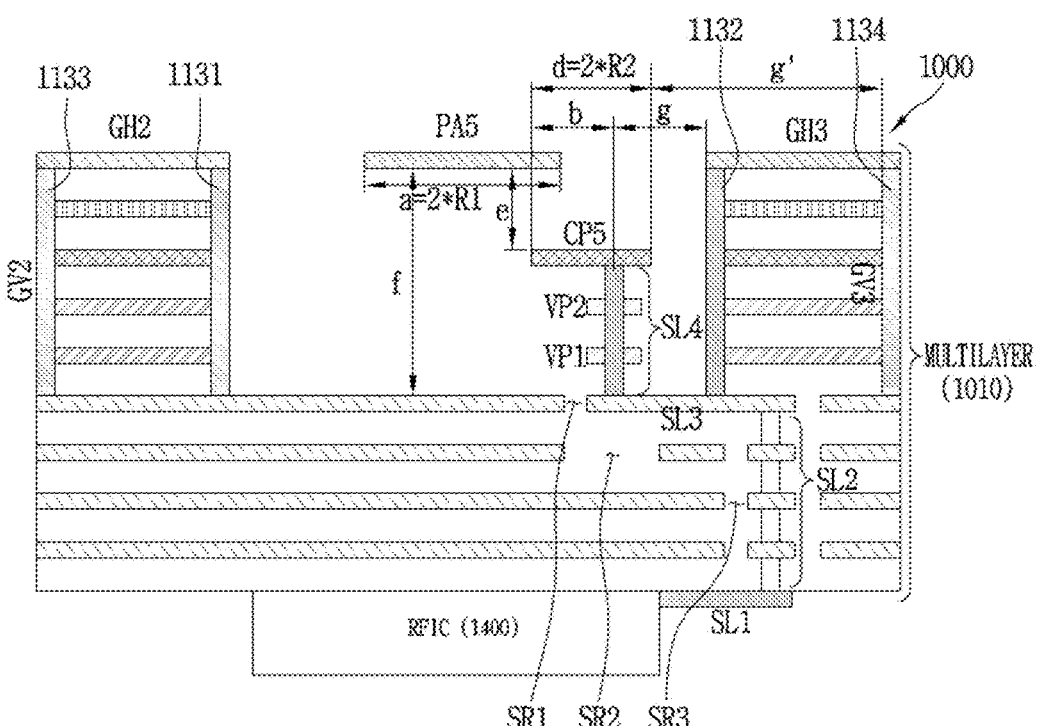
FIG. 5B illustrates size and spacing of radiators disposed on different layers and a spacing between the radiator and a ground wall in the lateral view of the antenna module of FIG. 5A.

Meanwhile, the patch antennas of the third array antenna 1200 according to the present disclosure may be stacked so that partial regions overlap. In this regard, FIG. 5A is a lateral view illustrating a partial region of the antenna module with patch antennas having an overlap structure, illustrated in FIG. 4. FIG. 5B illustrates size and spacing of radiators disposed on different layers and a spacing between the radiator and a ground wall in the lateral view of the antenna module of FIG. 5A.

Referring to FIGS. 4 and 5A, the array antenna disposition region 1010*r*1 forms a first vertical region VR1 including a plurality of layers. The first patch antenna 1220 and the second patch antenna 1210 may be disposed in the first vertical region VR1. The second patch antenna 1210 is connected to a fourth part SL4 of signal connection lines SL1 to SL4. The second patch antenna 1210 may be disposed to be offset toward one side or another side in the Y-axis direction of the first patch antenna 1220, such that a signal transmitted to the second patch antenna 1210 is coupled to the first patch antenna 1220.

Referring to FIGS. 4 and 5B, the second patch antenna 1210 may be formed to have a length of d=2*R2 in one axis direction. A distance b from one end portion of the second patch antenna 1210 to a point connected to the fourth part SL4 among the plurality of signal connection lines may be set to a value of b=R2. In this regard, a feed connection region of the second patch antenna 1210 may be offset from the center of the second patch antenna 1210 in one axial direction and may be formed at a center point in another axial direction. A distance g from the feed connection region of the second patch antenna 1210 to the horizontal ground wall GH2 may be equal to and greater than a predetermined spacing such that the characteristic change for each operating frequency is below a threshold. A distance g' from another end portion of the second patch antenna 1210 to the vertical ground wall GV3 may be equal to and greater than a predetermined spacing such that the characteristic change for each operating frequency is below a threshold.

Hereinafter, the antenna module 1000 including the plurality of layers according to the present disclosure will be described, with reference to FIGS. 4 and 5B. In the antenna module 1000 disclosed herein, the fourth part SL4 connected to the second patch antenna 1210 may be disposed in a dielectric region. In this case, a signal via corresponding to the fourth part SL4 may be disposed in the dielectric region so as not to be electrically connected to a ground region of a fourth lower conductive layer 1144. In relation to this, a slot region SR1 may be formed in the ground region of the fourth lower conductive layer 1144.

The antenna module 1000 may include at least one lower conductive layer below the fourth lower conductive layer 1144. In this regard, the antenna module 1000 may include a fourth lower conductive layer 1144 and a third lower conductive layer 1143 disposed below the fourth lower conductive layer 1144. The third lower conductive layer 1143 may be disposed on the same layer as a third part SL3 with being spaced apart from one end portion and another end portion of the third part SL3. Therefore, the plurality of lower conductive layers 1140 may include the third lower conductive layer 1143 and the fourth lower conductive layer 1144.

Meanwhile, one end portion of the third part SL3 and one end portion of the lower conductive layer 1143 may be points inside the bottom region of the second patch antenna 1210. In this regard, a region from which a conductive layer has been removed between the one end portion of the third part SL3 and the one end portion of the third lower conductive layer 1143 may also be referred to as a second slot region SR2. The third lower conductive layer 1143 may be electrically connected to the ground region of the fourth lower conductive layer 1144 to be implemented as a ground layer. Or, the third lower conductive layer 1143 may be electrically disconnected from the ground region of the fourth lower conductive layer 1144 to be implemented as a signal line.

On the other hand, the antenna module 1000 may further include a second lower conductive layer 1142 that is disposed below the third part SL3. The third lower conductive layer 1143 and the upper fourth lower conductive layer may be connected and thus the ground region of the fourth lower conductive layer 1144 may also be referred to as a third lower conductive layer. Therefore, the plurality of lower conductive layers 1140 may include the first lower conductive layer 1141, the second lower conductive layer 1142, and the third lower conductive layer 1143.

The second lower conductive layer 1142 may include a third slot region SR3, from which a conductive layer has been removed, in a region corresponding to the lower region of the second patch antenna 1210. A length of the third slot region SR3 on one axis may be longer than lengths of a plurality of pads of the fourth part SL4 as the signal via on the one axis. Therefore, the third slot region SR3, from which the conductive layer has been removed, is formed in a second ground layer GND2 which is located below a point where the fourth part SL4 connected to the second patch antenna 1210 is connected to the third part SL3.

Regions, such as the slot regions SR1 to SR3, from which the conductive layer has been removed, may be referred to as open spaces. The open spaces such as the slot regions SR1 to SR3 may lower a resonating frequency of an antenna to a low frequency band without increasing a size of the patch antenna. Therefore, as the ground region is partially removed, an entire height of the antenna can increase and thus the antenna can operate as a broadband antenna.

Also, the plurality of lower conductive layers 1140 may include a first lower conductive layer 1141, a second lower conductive layer 1142, a third lower conductive layer 1143, and a fourth lower conductive layer 1144. The first lower conductive layer 1141 may be disposed adjacent to a pad of the second part SL2 to cover a lower region of a region where the second patch antenna 1210 is disposed. The first lower conductive layer 1141 may be implemented as a ground layer. Alternatively, depending on an application, the first lower conductive layer 1141 may be implemented as a conductive layer which floats without being electrically connected to a ground layer. The first lower conductive layer 1141 may be implemented as a plurality of conductive layers that are separated from one another. Some of those conductive layers may operate as ground layers and the others may operate as conductive layers in a floating state.

Figure 7A:
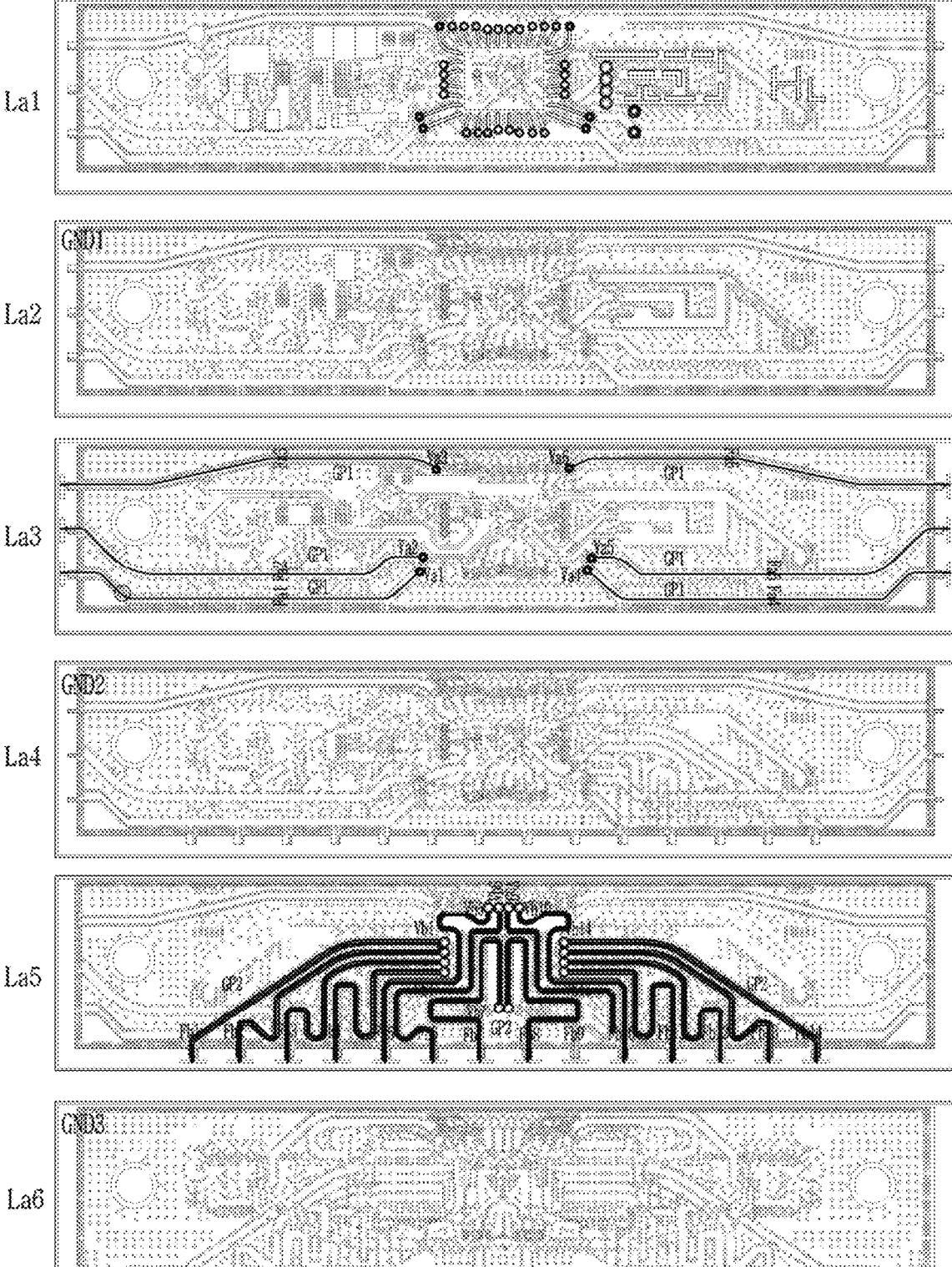
FIGS. 7A and 7B are front views illustrating the antenna module of FIG. 4 for each layer.
Figure 7B:
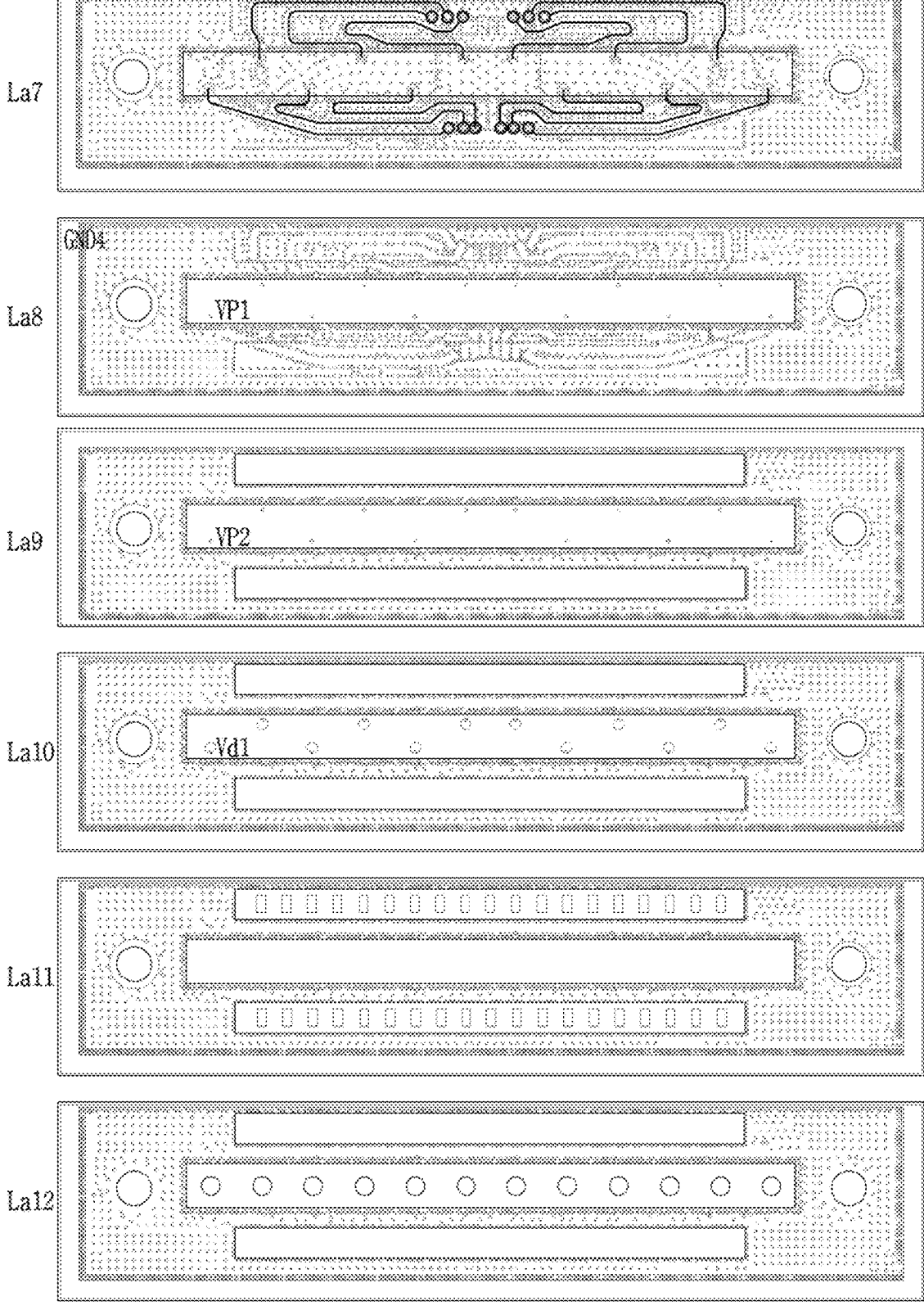

Meanwhile, the antenna module 1000 may further include vertical ground walls 1131 to 1134 each having a plurality of pads on top of the ground region of the fourth lower conductive layer 1144. The first patch antenna 1220 and the second patch antenna 1210, as illustrated in FIG. 7, may be stacked to partially overlap each other in the space between the vertical ground walls 1131 and 1132.

Patch antennas stacked to have overlap regions on different layers of the antenna module 1000 according to the present disclosure may be placed in a space formed by the ground wall 1130. Referring to FIGS. 3 to 5B, the ground wall 1130 may be formed along side regions of the substrate 1010 having the plurality of layers. In this regard, the ground wall 1130 may include conductive pads disposed on the plurality of layers, and vias connecting the conductive pads. The ground wall 1130 including the conductive pads and vias may be referred to as a ground via wall.

The ground wall 1130 may include a first ground wall 1131 formed along one side region of the first vertical region VR1, and a second ground wall 1132 formed along another side region. The ground wall 1130 may further include a third ground wall 1133 formed along one side region of the second vertical region VR2, and a fourth ground wall 1134 formed along one side surface of the third vertical region VR3.

The ground wall 1130 may be disposed on an edge of the substrate 1010 and an edge of the array antenna disposition region 1010r1 with respect to the first patch antenna 1220. The ground wall 1150 may be disposed on at least one of top, bottom, left, and right regions based on the first patch antenna 1220. The ground wall 1130 may be connected to the ground layer G1 to improve the antenna gain. Alternatively, the ground wall 1130 may be configured as a floating conductive wall merely formed of via pads without a vertical connection portion.

Figure 6:
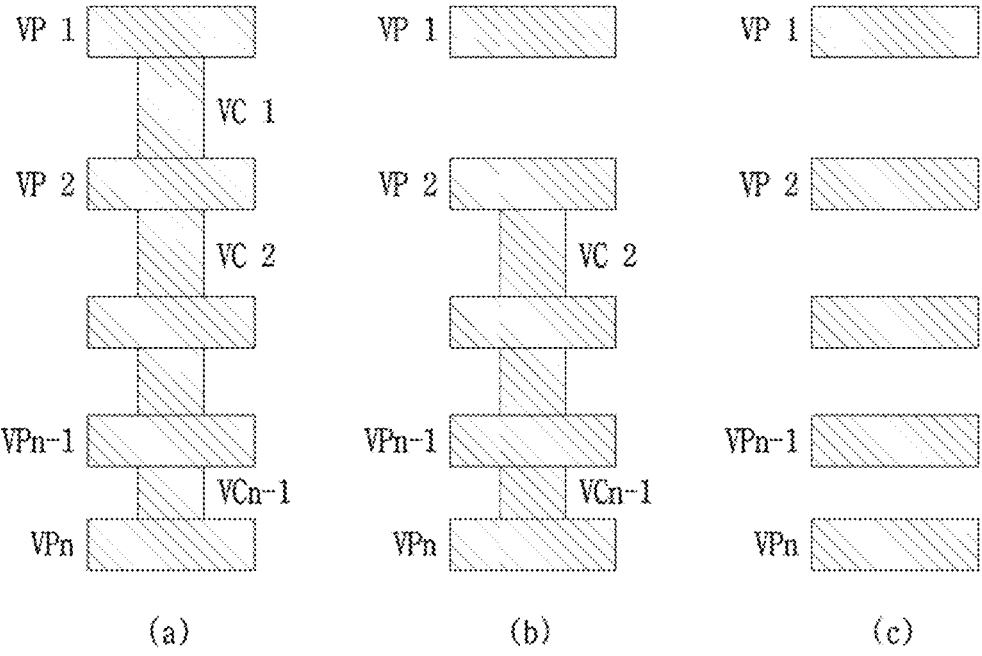
FIG. 6 illustrates via wall formation structures according to various embodiments.

In this regard, FIG. 6 illustrates via wall formation structures according to various embodiments. Referring to FIG. 6, the via wall may configure signal connection lines or connect a ground plane. Via pads VP1 to VPn in the form of thin film may be disposed on all the layers of the substrate 1010, but alternatively may be disposed only on several layers.

Referring to (a) and (b) of FIG. 6, the ground wall may include vertical connection portions VC1, VC2, . . . , VCn−1, and a plurality of pads VP1, VP2, . . . , VPn−1. Referring to (a) of FIG. 6, adjacent pads of the plurality of pads VP1, VP2, . . . , VPn−1 may be interconnected by one of the vertical connection portions VC1, VC2, . . . , VCn−1. On the other hand, referring to (b) FIG. 6, at least one adjacent pad of the plurality of pads VP1, VP2, . . . , VPn−1 of the ground wall 1130 may not be connected by the vertical connection portion.

As one example, the first pad VP1 and the second pad VP2 may be coupled without a vertical connection portion and the other pads may be connected by the vertical connection portions VP2 to VPn−1. However, with no limit thereto, the pads may be connected or may not be connected for each layer. In this regard, when signal lines are disposed in a region adjacent to via walls, the via walls may alternatively be coupled without a vertical connection portion. Upon the coupling without the vertical connection portion, a plurality of conductive layers may configure an electronic band gap (EBG) structure without being electrically connected to the ground layer. This can reduce interference due to an adjacent radiator or signal line or suppress deformation due to pressure or heat applied to the substrate 1010.

On the other hand, referring to (c) of FIG. 6, the plurality of pads VP1, VP2, . . . , VPn−1 of the ground wall 1130 may be coupled without vertical connection portions. Accordingly, the vertical ground walls GV1 to GV5 of FIGS. 3 to 5B may be implemented as any one structure of the ground walls of FIGS. (a) to (c) of FIG. 6.

Figure 8A:
FIG. 8A is a diagram illustrating first and third layers of the antenna module of FIG. 4.
Figure 8B:
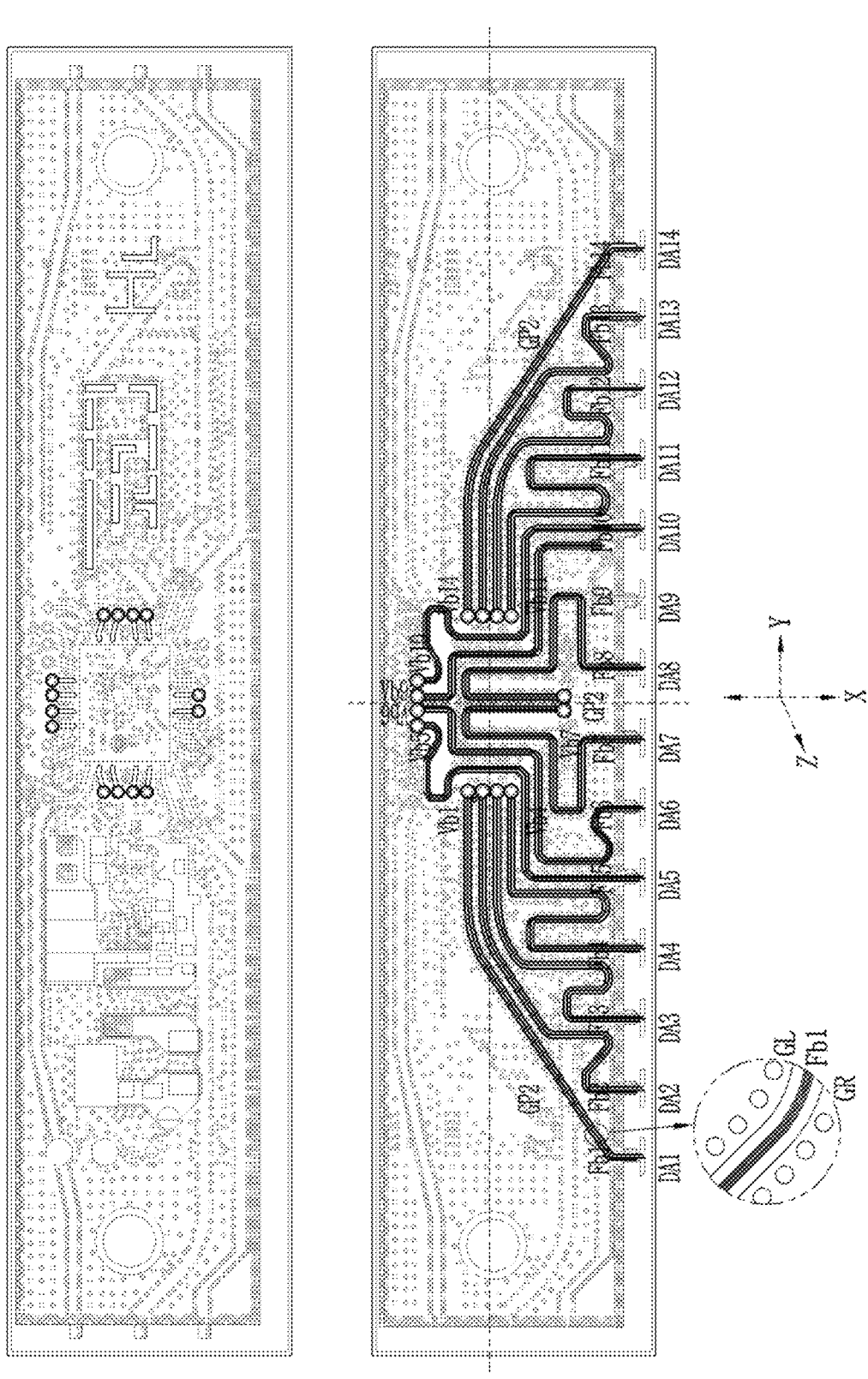
FIG. 8B is a diagram illustrating first and fifth layers of the antenna module of FIG. 4.
Figure 8C:
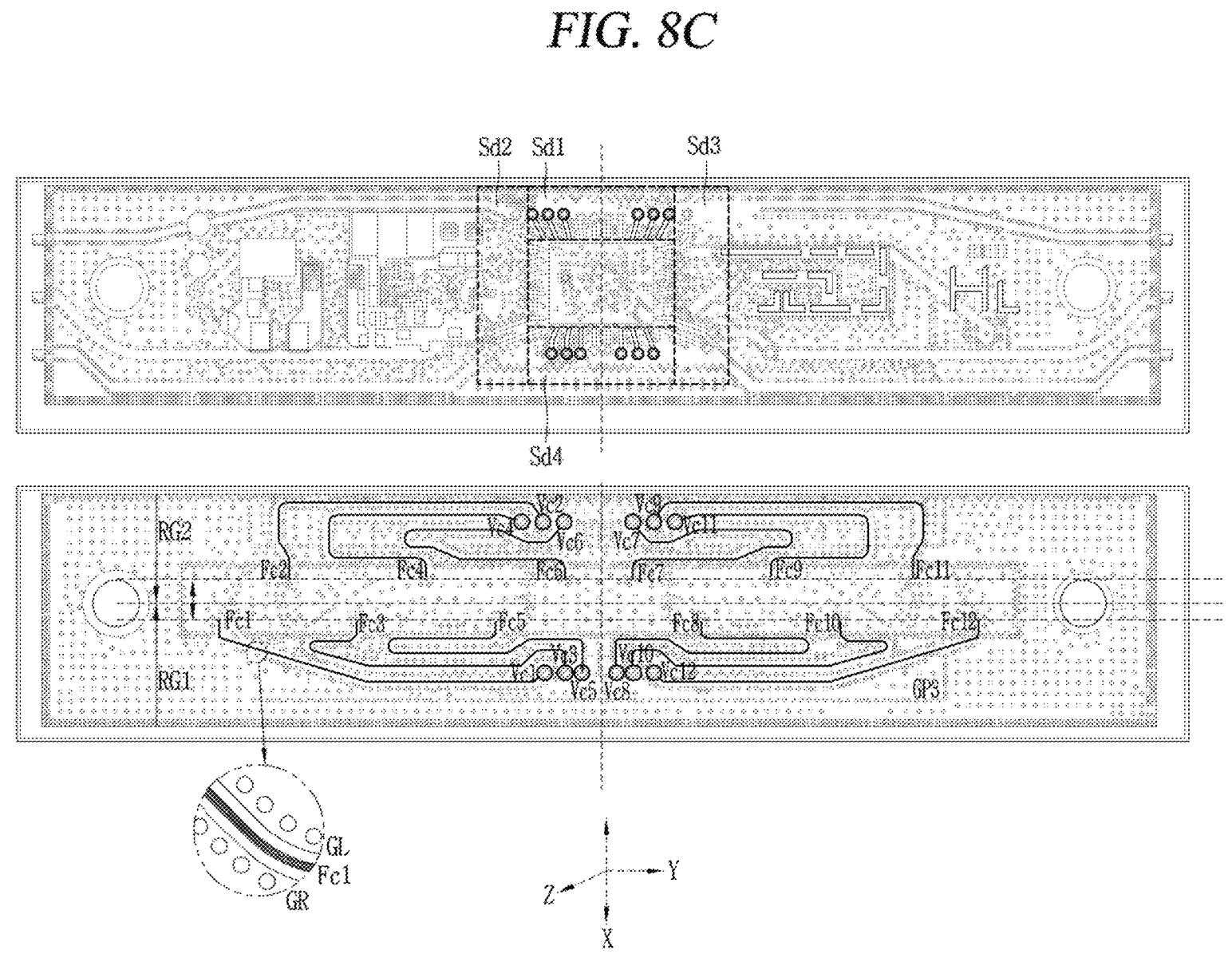

Hereinafter, a disposition structure for each layer of the antenna module according to the present disclosure will be described. In this regard, FIGS. 7A and 7A are front views illustrating the antenna module of FIG. 4 for each layer. On the other hand, FIG. 8A is a diagram illustrating first and third layers of the antenna module of FIG. 4. FIG. 8B is a diagram illustrating first and fifth layers of the antenna module of FIG. 4. FIG. 8C is a diagram illustrating first and seventh layers of the antenna module of FIG. 4.

Hereinafter, each layer of the antenna module 1000 will be described in detail with reference to FIGS. 2 to 8C. The antenna module 1000 may be configured by stacking layers from a first layer La1, on which the transceiver circuitry 1400 is disposed, to a fifth layer La5 and a sixth layer La6, on which the feed lines for the fourth array antenna 1300 are located. In addition, the antenna module 1000 may further include layers from a seventh layer La7, on which the feed lines for the third array antenna 1200 are disposed, to a twelfth layer La12, on which antenna elements of the third array antenna 1200 are disposed.

The transceiver circuitry 1400 may be disposed on the first layer La1. The transceiver circuitry 1400 may have a plurality of pins, and connection lines may be connected to the plurality of pins. The transceiver circuitry 1400 may be disposed based on a center line of the first layer La1 in one axial direction.

The second layer La2 may include a metal layer, so as to be configured as a first ground layer GND1 for the first layer La1. The dipole antennas DA21 to DA26 of the first and second array antennas 1100a and 1100b may be disposed on one side region and another side region of the third layer La3. End portions of first feed lines Fa1 to Fa6 of the dipole antennas DA21 to DA26 may be connected to signal connection lines of the first layer La1 by first vias Va1 to Va6. Ground patterns GL and GR with vias may be formed on one side and another side of each of the first feed lines Fa1 to Fa6, to form a first ground part GP1. Accordingly, the first feed lines Fa1 to Fa6 may be formed in a coplanar waveguide structure.

The fourth layer La4 may include a metal layer, so as to be configured as a second ground layer GND2 for the third layer La3. The first feed lines of the third layer La3 are disposed between the ground layer of the second layer La2 and the ground layer of the fourth layer La4. Accordingly, the first feed lines of the third layer La3 constitute a first coplanar waveguide structure in which the ground layers are disposed on an upper layer and a lower layer in a heightwise direction. The metal layers of the ground layer of the second layer La2 and the ground layer of the fourth layer La4 may be partially removed so that the first vias can be vertically connected.

The dipole antennas DA1 to DA14 of the fourth array antenna 1300 may be disposed in a bottom region of the fifth layer La5 on an XY plane. End portions of second feed lines Fb1 to Fb14 of the dipole antennas DA1 to DA14 may be connected to signal connection lines of the first layer La1 by second vias Vb1 to Vb14.

The sixth layer La6 may include a metal layer, so as to be configured as a ground layer GND3 for the fifth layer La5. The second feed lines of the fifth layer La5 are disposed between the ground layer of the fourth layer La4 and the ground layer of the sixth layer La6. Accordingly, the second feed lines of the fifth layer La5 constitute a second coplanar waveguide structure in which the ground layers are disposed on an upper layer and a lower layer in a heightwise direction. The metal layers of the ground layer of the fourth layer La4 and the ground layer of the sixth layer La6 may be partially removed so that the first and second vias can be vertically connected.

On the seventh layer La7, third feed lines for the second patch antennas CP1 to CP12 of the third array antenna 1200 may be disposed. Distances between one end portion and another end portion of the third feed lines may be the same. The third feed lines may be electrically connected to the lines of the first layer La1 by third vias Vc1 to Vc12 that are formed on one end portions of the third feed lines.

The eighth layer La8 may include a metal layer, so as to be configured as a fourth ground layer GND4. The third feed lines of the seventh layer La7 are disposed between the ground layer of the sixth layer La6 and the ground layer of the eighth layer La8. Accordingly, the third feed lines of the seventh layer La7 constitute a third coplanar waveguide structure in which the ground layers are disposed on an upper layer and a lower layer in a heightwise direction. The metal layers disposed in the ground layer of the sixth layer La6 and the ground layer of the eighth layer La8 may be partially removed so that the second and third vias can be vertically connected.

As described above, the second, fourth, sixth, and eighth layers La2, La4, La6, and La8 may configure the first to fourth ground layers GND1 to GND4, respectively. Connection vias may be disposed between the ground layers to electrically connect the ground layers. The substrate 1010 may include the first ground layer GND1 for the transceiver circuitry 1400 to the fourth ground layer GND4 for the third array antenna 1200. The first and second array antennas 1100a and 1100b may be configured such that an antenna and signal lines are disposed on a layer between the first ground layer GND1 and the second ground layer GND2.

The third array antenna 1200 may be configured such that an antenna and signal lines are disposed on the upper layer of the fourth ground layer GND4. The fourth array antenna 1300 may be configured such that an antenna and signal lines are disposed between the metal layer that is the ground layer of the fourth layer La4 and the metal layer that is the ground layer of the sixth layer La6. Accordingly, the signal lines of the first and second array antennas 1100a and 1100b, the third array antenna 1200, and the fourth array antenna 1300 may be isolated by the second to fourth ground layer GN2 to GND4. This can reduce interference between the signal lines of the array antennas which are isolated from one another by the second to fourth ground layers GND2 to GND4.

In the RFIC 1400, lengths of the feed lines of the third array antenna 1200 may be the same for all antenna elements. The lengths of the feed lines of the third array antenna 1200a may be determined as the sum of a first length L1a to a fourth length L4a. Lengths of the feed lines for all the second patch antennas CP1 to CP12 of the third array antenna 1200 may be the same. The first length L1a to the fourth length L4a may be the same for all the second patch antennas CP1 to CP12. Accordingly, signals applied from the RFIC 1400 to all the second patch antennas CP1 to CP12 can be in phase, and beams can be formed toward a center point.

The third vias Vc1 to Vc12 are vertically connected from the first layer La1 to the seventh layer La7. A ground region made of a metal layer and an array antenna disposition region 1010r1, which is a first dielectric region from which the metal layer has been removed, may be formed in each of the eighth to twelfth layers La8 to La12. The coupling patches CP1 to CP12 connected to ends of the third vias Vc9 to Vc12 may be disposed on a tenth layer La10. The coupling patches CP1 to CP12 may be referred to as feed plates.

The ground regions made of the metal layers formed on the first to twelfth layers La1 to La12 are connected by a plurality of vias. Coupling patches CP1 to CP12 of the third array antenna may be disposed on the tenth layer La10.

A metal layer forming a ground wall GW may be partially disposed on the eleventh layer La11. Second and third dielectric regions 1010*d*1 and 1010*d*2, from which the metal layer operating as the ground has been removed, may be formed in the top and bottom regions of the eleventh layer La11. The dummy patterns DP1 and DP2 may be disposed inside the second and third dielectric regions 1010*d*1 and 1010*d*2.

The ground region made of the metal layer and the second dielectric region 1010*d*1 and the third dielectric region 1010*d*2, from which metal layers have been removed, may be additionally formed on the tenth layer La10 to twelfth layer La12. The second and third dielectric regions 1010*d*1 and 1010*d*2 may correspond to the first and second dummy array pattern regions 1010*d*1 and 1010*d*2.

The first patch antennas PA1 to PA12 of the third array antenna 1200 may be disposed on the twelfth layer La12. Adjacent antennas among the first patch antennas PA1 to PA12 may be disposed at equal distances. The centers of the second patch antennas CP1 to CP12 may be offset from the centers of the first patch antennas PA1 to PA12 in the X-axis direction, which is the vertical axial direction.

Figure 9A:
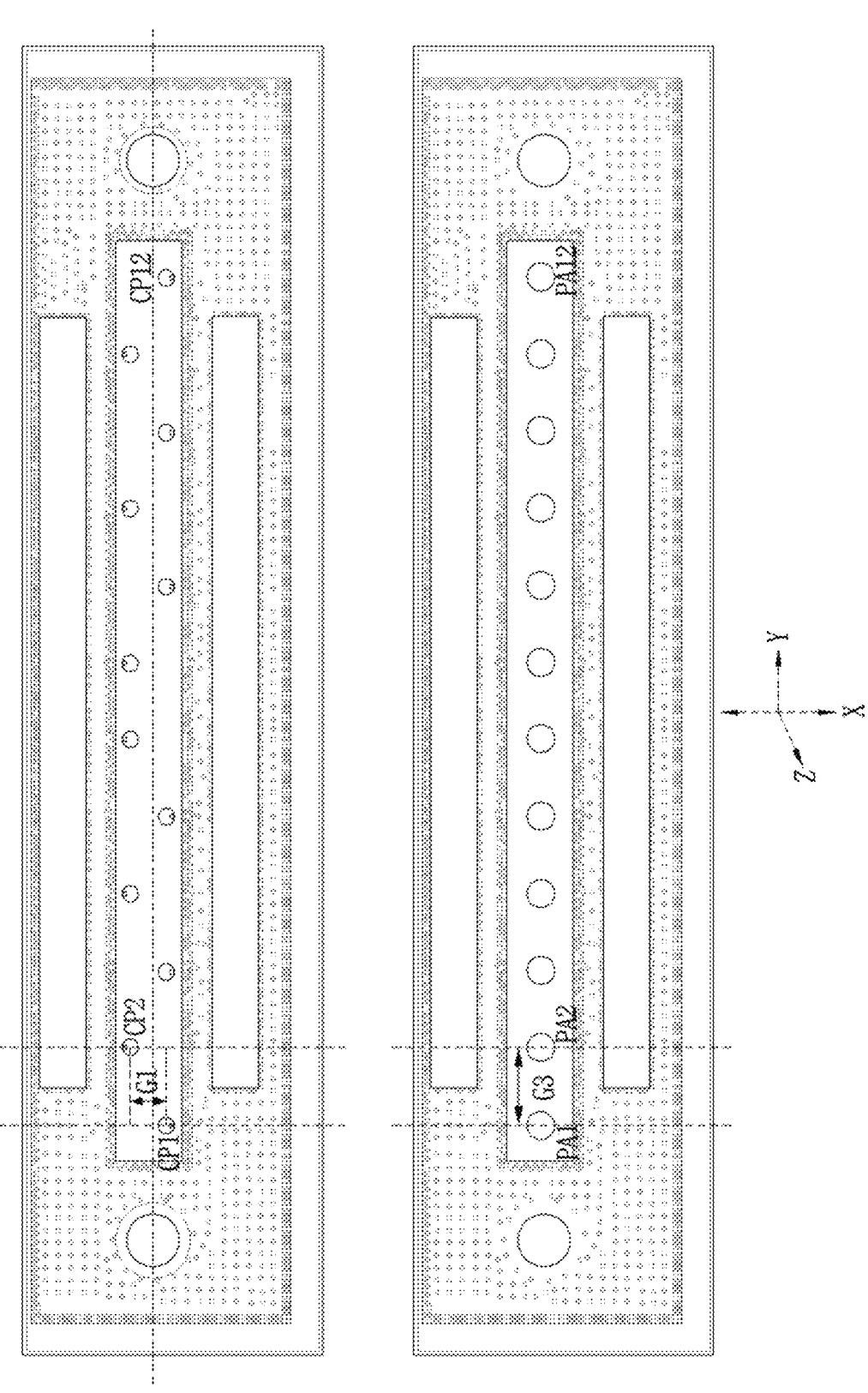
FIG. 9A is a diagram illustrating tenth and twelfth layers on which patch antennas of the antenna module of FIG. 4 are stacked.
Figure 9B:
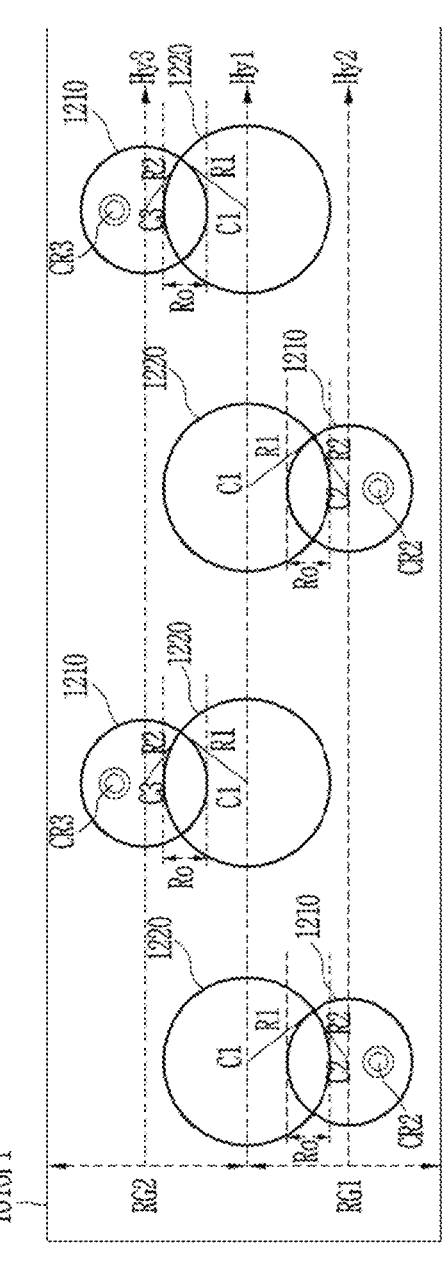
FIG. 9B is a diagram illustrating an overlap disposition structure of patch antennas disposed in an array antenna disposition region of the antenna module of FIG. 9A.

Hereinafter, a description will be given of a patch antenna disposition structure of an antenna module 1000 implemented as a multi-layered antenna package according to the present disclosure. In this regard, FIG. 9A is a diagram illustrating tenth and twelfth layers on which patch antennas of the antenna module of FIG. 4 are stacked. FIG. 9B is a diagram illustrating an overlap disposition structure of patch antennas disposed in an array antenna disposition region of the antenna module of FIG. 9A.

Referring to FIG. 9A, the first patch antennas PA1 to PA12 may be disposed equally at a third gap G3. Distances between the second patch antennas CP1 to CP12 may be equal to the third gap G3 on the X axis. On the other hand, the second patch antennas CP1 to CP12 may be disposed at a first gap G1 on the X axis. The first gap G1 may be shorter (narrower) than the third gap G3.

Referring to FIG. 9B, the first patch antennas 1220 may be disposed on a first horizontal axis Hy1 corresponding to the center of the array antenna disposition region 1010*r*1. Among the second patch antennas 1210, the centers of patch antennas of a first group may be aligned in a second vertical axis Hy2 and disposed in the first region RG1. The second horizontal axis Hy2 may be disposed in the first region RG1 at a predetermined distance from the first horizontal axis Hy1. Among the second patch antennas 1210, the centers of patch antennas of a second group may be aligned in a third vertical axis Hy3 and disposed in the second region RG2. The third horizontal axis Hy3 may be disposed in the second region RG2 at a predetermined distance from the first horizontal axis Hy1.

The first patch antenna 1220 may be configured as a circular patch antenna having a first diameter R1. The second patch antenna 1210 may be configured as a circular patch antenna having a second diameter R2 smaller than the first diameter R1. The first patch antenna 1220 and the second patch antenna 1210 may be disposed to have an overlap region Ro in an arcuate shape (i.e., arcuate region) in a vertical axial direction. The overlap region Ro between the first patch antenna 1220 and the second patch antenna 1210 belonging to the first group may be disposed in the first region RG1. The overlap region Ro between the first patch antenna 1220 and the second patch antenna 1210 belonging to the second group may be disposed in the second region RG2. The length of the overlap region Ro between the first and second patch antennas 1210 and 1220 may be shorter than a radius R2 of the second patch antenna 1210.

Upon connecting to the connection region CR2, CR3 through the feed via at an offset point, for example, a top/bottom point of the second patch antenna 1210, a polarization of electronic waves radiated from the second patch antenna 1210 is formed only in top and bottom directions. The connection regions CR2 and CR3 are formed at offset points by predetermined distances from the center point of the second patch antenna 1210.

A current distribution in regions adjacent to the connection regions CR2 and CR3 appears higher than that in surrounding regions. A mode formed on the second patch antenna on which the current distribution is made in the top and bottom directions is a TE11 mode.

The connection region CR2, CR3 may be formed on the second patch antenna 1210 in a direction away from the center of the second patch antenna 1210 in the X-axis direction. Therefore, the current generated on the second patch antenna 1210 in the top and bottom directions produces a dominant current distribution. Accordingly, the antenna elements including the first and second patch antennas 1210 and 1220 operate in the TE11 mode. This increases top and bottom co-polarization radiation performance, other than left and right cross-polarization, thereby improving antenna gain performance.

Left and right current components are attenuated by the TE 11 mode, so as to substantially disappear. Therefore, the co-polarization radiation performance corresponding to vertical polarization increases and the antenna gain is improved. Also, the cross-polarization component can be reduced, and thus data throughput performance improvement can be expected by virtue of MIMO performance improvement.

Hereinafter, an antenna module implemented as a multi-layered antenna package according to the present disclosure will be described with reference to FIGS. 2 to 9B. The antenna module 1000 implemented as a multi-layered antenna package may include a PCB 1010, a phased array antenna portion 1200, a bonded RFIC chip 1400, and a plurality of signal connection lines SL1 to SL4.

The PCB 1010 may include a plurality of layers. The PCB 1010 may include a plurality of conductive plates and dielectric layers. The plurality of conductive plates may be stacked with the dielectric layers interposed therebetween to be electrically separated from one another.

The phased array antenna portion 1200 may include a plurality of antenna elements PA1 to PA12 and CP1 to CP12. Each of the plurality of antenna elements PA1 to PA12 and CP1 to CP12 may be configured to have a structure with two patch antennas.

The first patch antenna PA1 to PA12 of the two patch antennas may be disposed on the first surface S1 of the PCB 1010, and the first surface S1 may be the outermost surface of the PCB 1010. The second patch antennas CP1 to CP12 of the two patch antennas may be disposed inside the PCB 1010. The second patch antennas CP1 to CP12 of the two patch antennas may be disposed on any one of the plurality of layers inside the PCB 1010. Some of the first patch antennas PA1 to PA12 and some of the second patch antennas CP1 to CP12 may be stacked to overlap each other in the X-axis direction, which is the vertical axial direction.

The RFIC chip 1400 may be disposed to be bonded to the second surface S2 of the PCB 1010 opposite to the first surface S1. The second surface S2 may be another outermost surface of the PCB 1010*a*.

The phased array antenna portion 1200 may be configured such that 12 antenna elements are disposed in the Y-axis direction, which is the horizontal axis. The first, third, fifth, eighth, tenth, and twelfth antenna elements of the phased array antenna portion 1200 may be connected on a specific layer to the feed lines Fc1, Fc3, Fc5, Fc8, Fc10, and Fc12 from the bottom region based on a center line. The second, fourth, sixth, seventh, ninth, and eleventh antenna elements of the phased array antenna portion 1200 may be connected on a specific layer to the feed lines Fc2, Fc4, Fc6, Fc7, Fc9, and Fc11 from the top region based on a center line. The bottom region of the PCB 1010 based on the Y-axis as the horizontal axis corresponds to a region, which has a negative X-coordinate value, of two regions divided by lines connecting the centers of the first patch antennas PA1 to PA12. The top region of the PCB 1010 based on the Y-axis as the horizontal axis corresponds to a region, which has a positive X-coordinate value, of the two regions divided by the lines connecting the centers of the first patch antennas PA1 to PA12.

The centers of the second patch antennas CP1 to CP12 may be aligned with the centers of the first patch antennas PA1 to PA12 in the Y-axis direction, which is the horizontal axial direction. The centers of the second patch antennas CP1 to CP12 may be stacked to overlap the centers of the first patch antennas PA1 to PA12 in the X-axis direction, which is the vertical axial direction.

A distance between the first patch antennas PA1 to PA12 may be equal to a third gap G3. A distance between the second patch antennas CP1 to CP12 may be equal to the third gap G3 on the Y axis. On the other hand, the second patch antennas CP1 to CP12 may be disposed at a first gap G1 on the X axis. The first gap G1 may be shorter (narrower) than the third gap G3.

Each of the plurality of signal connection lines SL1 to SL4 may be fed by being connected to the second patch antenna CP1 to CP12 inside the PCB 1010. Each of the plurality of signal connection lines SL1 to SL4 may be configured not to be directly connected to the first patch antennas PA1 to PA12 on the first surface S1 of the PCB 1010.

The plurality of signal connection lines SL1 to SL4 may be configured to connect the RFIC 1400 to the phased array antenna portion 1200. A length of each of the plurality of signal connection lines SL1 to SL4 may be a connected length between the RFIC 1400 and the phased array antenna portion 1200. Each of the plurality of signal connection lines SL1 to SL4 may be connected to the second patch antennas 1210 inside the PCB 1010. The length of the plurality of signal connection lines SL1 to SL4 is the connected length between the RFIC chip 1400 and the second patch antennas 1210. The plurality of signal connection lines SL1 to SL4 connected between the RFIC chip 1400 and the second patch antennas 1210 may be formed to have the same length. The plurality of signal connection lines SL1 to SL4 may be formed to have the same length for the first to twelfth antenna elements. The plurality of signal connection lines SL1 to SL4 may include feed lines Fc1 to Fc12 connected to the second patch antennas CP1 to CP12 of the phased array antenna portion 1200.

Among the plurality of signal connection lines SL1 to SL4, the signal connection lines of the first part SL1 disposed horizontally on the first layer La1 have the same length. The signal connection lines of the second part SL2 connected to the first part SL1 and disposed vertically on the inner layer of the PCB 1010 have the same length. The signal connection lines of the third part SL3 connected to the second part SL2 and horizontally disposed on one layer inside the PCB 1010 have the same length. The signal connection lines of the fourth part SL4 disposed vertically to be connected to the third part SL3 and the second patch antennas 1210 have the same length.

Among the plurality of signal connection lines SL1 to SL4, both sides of the signal connection lines of the third part SL3 may be formed as a coplanar waveguide structure in which the ground is disposed. The inner layer, on which the signal connection lines of the third part SL3 among the plurality of signal connection lines SL1 to SL4 are disposed, may be formed with an upper ground layer in the antenna direction and a lower ground layer in the RFIC direction. The signal connection lines of the third part SL3 among the plurality of signal connection lines SL1 to SL4 may be disposed on the seventh layer La7. The upper ground layer in the antenna direction may be a ground layer formed on the eighth layer La8. The lower ground layer in the RFIC direction may be a third ground layer GND3 formed on the sixth layer La6.

The antenna module 1000 implemented as the multi-layered antenna package may be configured to include a plurality of array antennas disposed in different regions of the PCB 1010. The antenna module 1000 may also include the first and second array antennas 1100a and 1100b, the third array antenna 1200, and the fourth array antenna 1300.

The first and second array antennas 1100a and 1100b may include first resonating elements DA21 to DA26 disposed on one side and another side of the PCB 1010. The first and second array antennas 1100a and 1100b may be configured to radiate signals toward one side and another side of the electronic device where the PCB 1010 is disposed.

The third array antenna 1200 may include a plurality of antenna elements PA1 to PA12 and CP1 to CP12 disposed on the central region CR of the PCB 1010. The third array antenna 1200 may be configured to radiate signals toward the bottom of the electronic device where the PCB 1010 is disposed.

The fourth array antenna 1300 may include second resonating elements DA1 to DA14 disposed in the bottom region of the PCB 1010. The fourth array antenna 1300 may be configured to radiate signals in the X-axis direction of the PCB 1010.

The first and second array antennas 1100a and 1100b may operate as horizontally polarized antennas that transmit signals in the Y-axis direction and have polarization in the X-axis direction. The first and second array antennas 1100a and 1100b may operate as horizontally polarized antennas that receive and transmit signals to a communication apparatus in the Y-axis direction and form an electric field in the X-axis direction. The third array antenna 1200 may operate as a vertically polarized antenna that transmits signals in the Z-axis direction and has polarization in the X-axis direction. The third array antenna 1200 may operate as a vertically polarized antenna that receives and transmits signals to a communication apparatus in the Z-axis direction and form an electric field in the X-axis direction.

The fourth array antenna 1300 may operate as a horizontally polarized antenna that transmits signals in the X-axis direction and has polarization in the Y-axis direction. The fourth array antenna 1300 may operate as a horizontally polarized antenna that receives and transmits signals to a communication apparatus in the X-axis direction and has polarization in the Y-axis direction.

Surfaces on which the first and second array antennas 1100a and 1100b and the fourth array antenna 1300 are disposed are formed at positions perpendicular to each other.

The signal transmission and reception direction of the first and second array antennas 1100*a* and 1100*b* and the signal transmission and reception direction of the fourth array antenna 1300 are perpendicular to each other.

Surfaces on which the first and second array antennas 1100*a* and 1100*b* and the third array antenna 1200 are disposed are formed at positions perpendicular to each other. The signal transmission and reception direction of the first and second array antennas 1100*a* and 1100*b* and the signal transmission and reception direction of the third array antenna 1200 are perpendicular to each other.

Surfaces on which the third array antenna 1200 and the fourth array antenna 1300 are disposed are formed at positions perpendicular to each other. The signal transmission and reception direction of the third array antenna 1200 and the signal transmission and reception direction of the fourth array antenna 1300 are perpendicular to each other.

Meanwhile, the antenna module 1000 implemented as the multi-layered antenna package may be configured to include a plurality of dielectric layers and coplanar waveguide layers. The antenna module 1000 may include a first dielectric layer DL1, a second dielectric layer DL2, and a third dielectric layer DL3. The antenna module 1000 may include a first coplanar waveguide layer WG1, a second coplanar waveguide layer WG2, and a third coplanar waveguide layer WG3.

The first dielectric layer DL1 may be disposed directly on a surface of an interface layer IL of the RFIC 1400. The first coplanar waveguide layer WG1 may be disposed on a top of the first dielectric layer DL1 in a height direction. The first coplanar waveguide layer WG1 may be configured to receive an RF signal transmitted by the interface layer IL of the RFIC 1400 and convey the received RF signal to the first and second array antennas 1100*a* and 1100*b*. The first coplanar waveguide layer WG1 may be configured to transmit the RF signal received from the first and second array antennas 1100*a* and 1100*b* to the interface layer IL of the RFIC 1400.

The second dielectric layer DL2 may be disposed on the first coplanar waveguide layer WG1. The second coplanar waveguide layer WG2 may be disposed on a top of the second dielectric layer DL2. The second coplanar waveguide layer WG2 may be configured to receive an RF signal transmitted by the interface layer IL of the RFIC 1400 and convey the received RF signal to the fourth array antenna 1300. The second coplanar waveguide layer WG2 may be configured to transmit the RF signal received from the fourth array antenna 1300 to the interface layer IL of the RFIC 1400.

The third dielectric layer DL3 may be disposed on the second coplanar waveguide layer WG2. The third coplanar waveguide layer WG3 may be disposed on a top of the third dielectric layer DL3. The third coplanar waveguide layer WG3 may be configured to receive an RF signal transmitted by the interface layer IL of the RFIC 1400 and convey the received RF signal to the third array antenna 1200. The third coplanar waveguide layer WG3 may be configured to transmit the RF signal received from the third array antenna 1200 to the interface layer IL of the RFIC 1400. The third coplanar waveguide layer WG3 may include thereon a plurality of second signal connection lines Fc1 to Fc12 and a ground portion GP3.

The RFIC chip 1400 may be disposed on the interface layer IL which is the first layer La1 of the PCB 1010. The first to third coplanar waveguide layers WG1, WG2, and WG3 may be disposed on the third, fifth, and seventh layers La3, La5, and La7 of the PCB 1010. The first, second, and third ground layers GND1, GND2, and GND3 may be disposed on the second, fourth, and sixth layers La2, La4, and La6 of the PCB 1010.

The plurality of signal connection lines SL1 to SL4 may include a first part SL1, a second part SL2, a third part SL3, and a fourth part SL4. The first part SL1 is horizontally disposed on the first layer La1. The second part SL2 is connected to the first part SL1 and is vertically disposed as an inner layer of the PCB 1010. The third part SL3 is connected to the second part SL2 and is horizontally disposed on any one layer inside the PCB 1010. The fourth part SL4 is vertically disposed to be connected to the third part SL3 and the second patch antennas 1210.

The first part SL1 of the plurality of signal connection lines may be disposed on the first layer La1 of the PCB 1010. The second part SL2 of the signal connection lines may correspond to first vertical vias connecting the first layer La1 and the sixth layer La7 of the PCB 1010. The third part SL3 of the plurality of signal connection lines may correspond to the feed lines Fc1 to Fc12 disposed on the seventh layer La7 of the PCB 1010. The fourth part SL4 of the plurality of signal connection lines may correspond to second vertical vias connecting ends of the feed lines Fc1 to Fc12 and the second patch antennas 1210.

First and second patch antennas 1210 may be disposed inside the PCB 1010. The first and second patch antennas 1210 may be disposed inside the array antenna disposition region 1010*r*1 of the PCB 1010. A first group of second patch antennas 1210 disposed inside the PCB 1010 may be electrically connected to the fourth parts SL4 of the signal feed lines in the first region RG1 based on a center line of an inner layer where the second patch antennas 1210 are disposed. A second group of second patch antennas 1210 disposed inside the PCB 1010 may be electrically connected to the fourth parts SL4 of the signal feed lines in the second region RG2 based on the center line of the inner layer where the second patch antennas 1210 are disposed.

Signals applied from the RFIC 1400 to the patch antennas through the signal connection lines SL1 to SL4 may include first signals and second signals. Among the signals applied to the patch antennas, the first signals may be applied to the first group of patch antennas among the second patch antennas 1210. Among the signals provided to the patch antennas, the second signals may be applied to the second group of patch antennas among the second patch antennas 1210. The first signals applied to the first group of patch antennas may be controlled to have the same phase as each other. The second signals applied to the second group of patch antennas may be controlled to have the same phase as each other. The first signals applied to the first group of patch antennas and the second signals applied to the second group of patch antennas may be controlled to have a phase difference of 180 degrees.

Among the second patch antennas 1210, the centers of the first group of patch antennas may be aligned in the first region RG1 in a second horizontal axis (Hy2) direction, which is spaced in parallel apart a predetermined gap from a first horizontal axis Hy1 where the first patch antennas 1220 are disposed. Among the second patch antennas 1210, the centers of the second group of patch antennas may be aligned in the second region RG2 in a third horizontal axis (Hy3) direction, which is spaced in parallel apart a predetermined gap from the first horizontal axis Hy1 where the first patch antennas 1220 are disposed.

The centers C2 and C3 of the second patch antennas 1210 may be formed on the same axis as the center C1 of the first patch antennas 1220 in the X-axis direction which is the vertical axis direction. The second patch antennas 1210 and the first patch antennas 1220 may be stacked to overlap each other. Connection regions CR2 and CR3 of the second patch antennas 1210 connected to the fourth parts SL4 of the signal connection lines may be formed on the same axis in the X-axis direction. The connection regions CR2 and CR3 of the second patch antennas 1210 connected to the fourth parts SL4 may be disposed in a region spaced apart from the centers C2 and C3 of the second patch antennas 1210.

The feed lines Fc1 to Fc12 may include lower feed lines Fc1, Fc3, Fc5, Fc8, Fc10, and Fc12 disposed in the first region RG1, and upper feed lines Fc2, Fc4, Fc6, Fc7, Fc9, and Fc11 disposed in the second region RG2. The lower feed lines Fc1, Fc3, Fc5, Fc8, Fc10, and Fc12 may be connected to the second patch antennas CP1, CP3, CP5, CP8, CP10, and CP12 of the first, third, fifth, eighth, tenth, and twelfth antenna elements. The upper feed lines Fc2, Fc4, Fc6, Fc7, Fc9, and Fc11 may be connected to the second patch antennas CP2, CP4, CP6, CP7, CP9, and CP11 of the second, fourth, sixth, seventh, ninth, and eleventh antenna elements.

Ends of the upper feed lines Fc2, Fc4, Fc6, Fc7, Fc9, and Fc11 may be disposed in the top region of the PCB 1010 based on the Y-axis. Ends of the lower feed lines Fc1, Fc3, Fc5, Fc8, Fc10, and Fc12 may be disposed in the bottom region of the PCB 1010 based on the Y-axis. The ends of the upper feed lines Fc2, Fc4, Fc6, Fc7, Fc9, and Fc11 and the ends of the lower feed lines Fc1, Fc3, Fc5, Fc8, Fc10, and Fc12 may be spaced apart from each other by a first gap G1 on the Y-axis of the PCB 1010. A distance between the first patch antennas PA1 to PA12 may be equal to the third gap G3 on the Y-axis. The second patch antennas CP1 to CP12 may be disposed at the third gap G3 on the Y axis and at the first gap G1 on the X axis. The first gap G1 may be shorter (narrower) than the third gap G3.

Meanwhile, the RFIC chip 1400 may be connected to a plurality of array antennas through a plurality of pins disposed on a first side surface Sd1 as a top region, a second side surface Sd2 as one side region, a third side surface Sd3 as another side region, and a fourth side surface Sd4 as a bottom region.

Pins on the first side surface Sd1, which is the top region of the RFIC chip 1400, may be connected to the upper feed lines Fc2, Fc4, Fc6, Fc7, Fc9, and Fc11 through the first vertical vias SL2. Pins on the fourth side surface Sd4, which is the bottom region of the RFIC chip 1400, may be connected to the lower feed lines Fc1, Fc3, Fc5, Fc8, Fc10, and Fc12 through the first vertical vias SL2.

Meanwhile, second vertical vias SL4 may be disposed on the eighth, ninth, and tenth layers of the PCB 1010. The second patch antennas CP1 to CP12 may be disposed on the tenth layer La10 of the PCB 1010. Ends of the second vertical vias SL4 may be connected to the second patch antennas CP1 to CP12 of the tenth layer La10. The first patch antennas PA1 to PA12 may be disposed on the twelfth layer La12 of the PCB 1010. The second patch antennas CP1 to CP12 may be configured not to be connected to the first patch antennas PA1 to PA12. The second patch antennas CP1 to CP12 may be electrically connected to the first patch antennas PA1 to PA12 through coupling.

Connection points Vb1 to Vb12 of the first vertical vias SL2 disposed on the seventh layer La7 of the PCB 1010 may be symmetrically aligned with respect to the X-axis of the center line of the PCB 1010. Feeding points Fc1 to Fc12 of the second vertical vias SL4 connected to the second patch antennas CP1 to CP12 may be symmetrically aligned with respect to the X-axis of the center line of the PCB 1010.

The second patch antennas CP1, CP3, CP5, CP8, CP10, and CP12) of the first, third, fifth, eighth, tenth, and twelfth antenna elements and the first, third, fifth, eighth, tenth, and twelfth feed lines Fc1, Fc3, Fc5, Fc8, Fc10, and Fc12 may be electrically connected by lines disposed in the first region among the second vertical vias SL4. The second patch antennas CP2, CP4, CP6, CP7, CP9, and CP11 of the second, fourth, sixth, seventh, ninth, and eleventh antenna elements and the second, fourth, sixth, seventh, ninth, and eleventh feed lines Fc2, Fc4, Fc6, Fc7, Fc9, and Fc11 may be electrically connected by lines disposed in the second region among the second vertical vias SL4.

The feeding points of the first and second feed lines Fc1 and Fc2, the feeding points of the third and fourth feed lines Fc3 and Fc4, and the feeding points of the fifth and sixth feed lines Fc5 and Fc6 in the left region of the PCB 1010 may be spaced apart by a first gap G1 in the X-axis direction. The feeding points of the seventh and eighth feed lines Fc7 and Fc8, the feeding points of the ninth and tenth feed lines Fc9 and Fc10, and the feeding points of the eleventh and twelfth feed lines Fc11 and Fc12 in the right region of the PCB 1010 may be spaced apart by the first gap G1 in the X-axis direction.

The first and second array antennas 1100*a* and 1100*b* may be disposed in one side region and another side region on the XY plane of the first coplanar waveguide layer WG1. The fourth array antenna 1300 may be disposed in the bottom region based on the Y-axis on the XY plane of the second coplanar waveguide layer WG2. The first, third, fifth, eighth, tenth, and twelfth feed lines Fc1, Fc3, Fc5, Fc8, Fc10, and Fc12 of the third array antenna 1200 may be disposed in the top region based on the Y-axis on the XY plane of the third coplanar waveguide layer WG3. The second, fourth, sixth, seventh, ninth, and eleventh feed lines Fc2, Fc4, Fc6, Fc7, Fc9, and Fc11 of the third array antenna 1200 may be disposed in the bottom region based on the Y-axis on the XY plane of the third coplanar waveguide layer WG3.

The first and second array antennas 1100*a* and 1100*b* may be implemented as 1×3 dipole antennas DA21 to DA23 and DA24 to DA26 in one side region and another side region on the XY plane of the first coplanar waveguide layer WG1, respectively. The fourth array antenna 1300 may be implemented as a 1×14 dipole antenna in the bottom region based on the Y-axis on the XY plane of the second coplanar waveguide layer WG1. The third array antenna 1200 may be implemented as a 1×12 patch antenna on the center portion of the third coplanar waveguide layer WG3 of the PCB 1010.

The foregoing description has been given of an antenna module implemented with a multi-layered substrate. Hereinafter, technical effects of an antenna module implemented as a multi-layered substrate according to the present disclosure will be described.

The above-mentioned multi-layered circuit type antenna package presents a structure that can wirelessly transmit broadband signals by minimizing the number of stacks.

The above-described multi-layered circuit type antenna package has low loss during signal transmission and is economical in process cost.

Further scope of applicability of the present disclosure will become apparent from the following detailed description. It should be understood, however, that the detailed description and specific examples, such as the preferred embodiment of the present disclosure, are given by way of illustration only, since various modifications and alterations within the idea and similar scope of the disclosure will be apparent to those skilled in the art. Therefore, all changes and modifications that fall within the metes and bounds of the claims, or equivalents of such metes and bounds are therefore intended to be embraced by the appended claims.

What is claimed is:

1. An antenna module implemented as a multi-layered package, the antenna module comprising:

a printed circuit board (PCB) having a plurality of layers;

an array antenna portion including a plurality of antenna elements disposed on the PCB, wherein each of the plurality of antenna elements has a structure with two patch antennas, a first patch antenna of the two patch antennas is disposed on a first surface of the PCB, the first surface is an outermost surface of the PCB, a second patch antenna of the two patch antennas is disposed to be spaced apart from the first patch antenna and is disposed on one of the plurality of layers inside the PCB, a portion of the first patch antenna and a portion of the second patch antenna are stacked to overlap each other;

a radio frequency integrated circuit (RFIC) chip bonded to a second surface of the PCB, the second surface being another outermost surface of the PCB; and a plurality of signal connection lines configured to electrically connect the RFIC chip to the array antenna portion, wherein the signal connection lines comprises a first part disposed horizontally on a first layer, a second part connected to the first part and disposed vertically as an inner layer of the PCB, a third part connected to the second part and disposed on any one layer inside the PCB, and a fourth part disposed vertically to be connected to the third part and the second patch antennas, the first patch antennas disposed on the outermost surface of the PCB are disposed at a certain gap on the outermost surface in a first horizontal axis direction, a first group of the second patch antennas disposed inside the PCB is electrically connected to the fourth parts of the signal connection lines in a first region based on a center line of an inner layer where the second patch antennas are disposed, and a second group of the second patch antennas disposed inside the PCB is electrically connected to the fourth parts of the signal connection lines in a second region based on the center line of the inner layer where the second patch antennas are disposed.

2. The antenna module of claim 1, wherein signals applied from the RFIC to the patch antennas through the signal connection lines comprise:

first signals applied to the first group of patch antennas among the second patch antennas; and second signals applied to the second group of patch antennas among the second patch antennas, the first signals have the same phase as each other, the second signals have the same phase as each other, and the first signals and the second signals have a phase difference of 180 degrees.

3. The antenna module of claim 1, wherein centers of the first group of patch antennas among the second patch antennas are aligned in a first region in a second horizontal axis direction, which is spaced in parallel apart a certain gap from a first horizontal axis where the first patch antennas are disposed, and centers of the second group of patch antennas among the second patch antennas are aligned in a second region in a third horizontal axis direction, which is spaced in parallel apart a certain gap from the first horizontal axis where the first patch antennas are disposed.

4. The antenna module of claim 1, wherein centers of the second patch antennas are disposed on the same axis as centers of the first patch antennas in an X-axis direction which is a vertical axis direction, and the second patch antennas and the first patch antennas are stacked to overlap each other, connection regions of the second patch antennas connected to the fourth parts of the signal connection lines are formed on the same axis in the X-axis direction, and the connection region is disposed in a region spaced apart from the center of the second patch antenna.

5. The antenna module of claim 1, wherein the plurality of signal connection lines are connected to the second patch antennas inside the PCB, respectively, a length of each of the plurality of signal connection lines is a connected length between the RFIC chip and the second patch antenna, and the plurality of signal connection lines have the same length.

6. The antenna module of claim 5, wherein among the plurality of signal connection lines, the signal connection lines of the first part disposed horizontally on the first layer have the same length, the signal connection lines of the second part connected to the first part and disposed vertically as the inner layer of the PCB have the same length, the signal connection lines of the third part connected to the second part and disposed horizontally on any one layer inside the PCB have the same length, and the signal connection lines of the fourth part disposed vertically to be connected to the third part and the second patch antennas have the same length.

7. The antenna module of claim 1, wherein both sides of signal connection lines of the third part among the plurality of signal connection lines are formed as a coplanar waveguide structure in which grounds are disposed.

8. The antenna module of claim 1, wherein the inner layer, on which the signal connection lines of the third part among the plurality of signal connection lines are disposed, is provided with an upper ground layer in a direction toward an antenna and a lower ground layer in a direction toward the RFIC.

9. The antenna module of claim 1, wherein the first surface defines the outermost surface of the PCB and is formed of a metal layer connected to a ground, and an inner surface of the metal layer has a first region where the first patch antenna is disposed, and a second region and a third region that are defined on both sides of the first region and do not operate as a ground.

10. The antenna module of claim 9, wherein a first vertical region which is the same as the first region is defined from an outermost surface of the PCB to an upper ground layer in a direction toward an antenna, above an inner layer of the PCB, on which the signal connection lines of the third part are disposed, and an antenna element and a dielectric material are disposed in the first vertical region, and an outer peripheral surface of the first vertical region forms ground walls.

11. The antenna module of claim 9, wherein a second vertical region which is the same as the second region is defined from an outermost surface of the PCB to a ground layer inside the PCB, first parasitic metals and a dielectric material are disposed in the second vertical region, an outer peripheral surface of the second vertical region forms ground walls, a third vertical region which is the same as the third region is defined from an outermost surface of the PCB to a ground layer inside the PCB, second parasitic metals and a dielectric material are disposed in the third vertical region, and an outer peripheral surface of the third vertical region forms ground walls.

12. The antenna module of claim 11, wherein a first vertical height of the first vertical region is higher than a second vertical height of the second vertical region.

*   *   *   *   *